(12) United States Patent
Hsu

(10) Patent No.: US 12,080,466 B2
(45) Date of Patent: Sep. 3, 2024

(54) ELECTRONIC PACKAGE

(71) Applicant: PHOENIX PIONEER TECHNOLOGY CO., LTD., Hsinchu County (TW)

(72) Inventor: Che-Wei Hsu, Hsinchu County (TW)

(73) Assignee: PHOENIX PIONEER TECHNOLOGY CO., LTD., Hsinchu County (TW)

(*) Notice: Subject to any disclaimer, the term of this patent is extended or adjusted under 35 U.S.C. 154(b) by 225 days.

(21) Appl. No.: 17/899,842

(22) Filed: Aug. 31, 2022

(65) Prior Publication Data

US 2023/0064355 A1  Mar. 2, 2023

(30) Foreign Application Priority Data

Sep. 1, 2021  (TW) ................. 110132454

(51) Int. Cl.
| | | |
|---|---|---|
| *H01F 27/28* | (2006.01) | |
| *H01F 41/04* | (2006.01) | |
| *H01L 21/48* | (2006.01) | |
| *H01L 23/00* | (2006.01) | |
| *H01L 23/498* | (2006.01) | |
| *H01L 23/552* | (2006.01) | |
| *H01L 25/16* | (2023.01) | |
| *H01L 49/02* | (2006.01) | |

(52) U.S. Cl.
CPC ..... *H01F 27/2885* (2013.01); *H01F 27/2804* (2013.01); *H01F 41/042* (2013.01); *H01F 41/043* (2013.01); *H01L 21/4857* (2013.01); *H01L 23/49822* (2013.01); *H01L 23/49838* (2013.01); *H01L 23/552* (2013.01); *H01L 24/24* (2013.01); *H01L 25/16* (2013.01); *H01L 28/10* (2013.01); *H01F 2027/2809* (2013.01); *H01L 2224/24226* (2013.01); *H01L 2224/244* (2013.01); *H01L 2224/245* (2013.01); *H01L 2924/01029* (2013.01)

(58) Field of Classification Search
CPC ............ H01F 27/2885; H01F 27/2804; H01F 2027/2809; H01L 25/16; H01L 2224/24226
USPC ........................................................ 361/761
See application file for complete search history.

(56) References Cited

U.S. PATENT DOCUMENTS

| | | | |
|---|---|---|---|
| 6,800,929 B1 * | 10/2004 | Nishijima | ............... H01L 28/10 257/664 |
| 2019/0321628 A1 * | 10/2019 | Stevenson | ................ H03H 1/00 |

* cited by examiner

*Primary Examiner* — Andargie M Aychillhum
(74) *Attorney, Agent, or Firm* — Amin, Turocy & Watson, LLP

(57) ABSTRACT

An electronic package is provided and includes an electronic element connected to a plurality of inductor circuits embedded in an insulator of a package substrate by fan-out conductive copper pillars, and at least one shielding layer non-electrically connected to the inductor circuits, where the shielding layer includes a plurality of line segments not connected to each other, such that the shielding layer shields the inductor circuits, thereby achieving the electrical requirements of high-current products while improving the inductance value and quality factor.

22 Claims, 24 Drawing Sheets

ELECTRONIC PACKAGE

BACKGROUND

1. Technical Field

The present disclosure relates to an electronic package, in particular, to an electronic package with an inductor structure of a package carrier.

2. Description of Related Art

In general semiconductor application devices, such as communication or high-frequency semiconductor devices, it is often necessary to electrically connect most radio-frequency (RF) passive elements, such as resistors, inductors, capacitors and oscillators to the packaged semiconductor chip, so that the semiconductor chip has a specific current characteristic or output signal. For example, there are many types of conventional inductors, with various applications (filtering, choke flow, DC-DC converter, etc., but not limited to the above), advantages and disadvantages.

For example, under the requirements of high-density element configuration and miniaturization of RF modules, the spiral inductive elements commonly used in devices with RF modules reduce the distance between each element, but also easily generate an electromagnetic interference between each element. Therefore, how to prevent electromagnetic interference between various elements, and how to provide better magnetic shielding, anti-electromagnetic interference capability, and miniaturization of the inductive elements are the challenges faced by conventional inductive elements.

Also, when the spiral inductive elements are used in high frequency applications, how to provide lower magnetic loss, lower eddy current effect and higher inductance value so as to obtain a better Q value, reduce the energy consumption of the inductive elements, improve the performance, and achieve well electrical properties are other challenges that conventional inductive elements need to overcome constantly.

Due to the above problems, TWI611439, as shown in FIG. 1, uses a magnetic covering member (part number 130, 132, 134) to provide magnetic shielding and anti-electromagnetic interference capabilities, but the magnetic permeability after mixing magnetic powder in the insulating material is relatively low compared with the original magnetic powder, such that the mixture still limits the ability to improve inductance value, magnetic shield and anti-electromagnetic interference of the inductive element.

Furthermore, when the magnetic powder is mixed in the insulating material, the uniformity of the mixture is poor, which makes it difficult to control the magnetic permeability (e.g., magnetic conductivity), and the magnetic powder in the carrier is not suitable for the circuit patterning process due to its material properties, so the build-up circuit fabrication cannot be carried out on the dielectric layer or the magnetic covering member in the subsequent process.

In addition, a coil element 100 as shown in FIG. 1 of TWI611439 is fabricated by injection molding, transfer molding, or low temperature co-firing process, etc., which results in poor processability, so it can only be processed in a small area and cannot be mass-produced with a large board, such that the processing cost of the inductor remains high, and the geometric accuracy of the fabricated coil element is not good, resulting in poor tolerance of the inductance value.

Therefore, there is a need for a solution that addresses the aforementioned shortcomings of the prior art.

SUMMARY

In view of the aforementioned shortcomings of the prior art, the present disclosure provides an electronic package, which comprises: an insulator formed as a package substrate and having a first side and a second side opposing the first side; a plurality of layers of spiral inductor circuits embedded in the insulator in a form of layered interval stacking; at least one conductor embedded in the insulator and connected to any two of the adjacent spiral inductor circuits stacked at interval; a plurality of shielding layers oppositely embedded in the first side and the second side of the insulator to shield the spiral inductor circuits without being electrically connected to the spiral inductor circuits, wherein the plurality of shielding layers comprise a plurality of line segments without connecting to each other; a build-up circuit structure having a third side and a fourth side opposing the third side and stacked on the first side of the insulator via the fourth side thereof, wherein the build-up circuit structure is electrically connected to the spiral inductor circuits; and at least one electronic element embedded and packaged in the build-up circuit structure and electrically connected to the build-up circuit structure via fan-out conductive copper pillars.

The present disclosure further provides an electronic package, which comprises: a build-up circuit structure having a third side and a fourth side opposing the third side; at least one electronic element embedded and packaged in the build-up circuit structure and electrically connected to the build-up circuit structure; an insulator formed as a package substrate and having a first side and a second side opposing the first side, wherein the insulator is stacked on the third side of the build-up circuit structure via the second side thereof; a plurality of layers of spiral inductor circuits embedded in the insulator in a form of layered interval stacking, wherein the spiral inductor circuits are electrically connected to the build-up circuit structure; at least one conductor embedded in the insulator and connected to any two of the adjacent spiral inductor circuits stacked at interval; and a plurality of shielding layers oppositely embedded in the first side and the second side of the insulator to shield the spiral inductor circuits without being electrically connected to the spiral inductor circuits, wherein the plurality of shielding layers comprise a plurality of line segments without connecting to each other.

In the aforementioned two kinds of the electronic packages, a material for forming the insulator comprises Ajinomoto build-up film, polyimide, or molded epoxy resin.

In the aforementioned two kinds of the electronic packages, the present disclosure further comprises at least one conductive pillar embedded in the insulator and electrically connected to at least one end of the spiral inductor circuits. In addition, the inductor structure can further comprise at least one electrical connecting pad formed on the first side or the second side of the insulator and electrically connected to the conductive pillar, wherein the electrical connecting pad is exposed from the insulator. Further, a cross-sectional shape and an area of the pillar are correspondingly similar to those of the electrical connecting pad.

In the aforementioned two kinds of the electronic packages, the conductor corresponds to a shape of each of the spiral inductor circuits to form an arc-shaped sheet body or an arc-shaped wall body.

In the aforementioned two kinds of the electronic packages, rotated directions of any two adjacent of the plurality of layers of spiral inductor circuits are the same or opposite.

In the aforementioned two kinds of the electronic packages, the plurality of line segments without connecting to each other of the shielding layers are arranged in a pattern of a circular outline or a polygonal outline to present in a radial shape, a polycyclic shape, or a straight-parallel shape.

In the aforementioned two kinds of the electronic packages, a composition of the shielding layers comprises a magnetic material or a non-magnetic metal.

In the aforementioned two kinds of the electronic packages, partial surfaces of the shielding layers are provided with a magnetic layer comprising a magnetic material, and the shielding layers are composed of a non-magnetic metal.

In the aforementioned two kinds of the electronic packages, the present disclosure further comprises a core body embedded in the insulator, wherein the spiral inductor circuits surround the core body. For example, the core body comprises at least one annular conductive pillar or at least one solid conductive pillar. Further, a composition of the core body comprises a magnetic material or a non-magnetic metal. Also, a partial surface of the core body is provided with a magnetic layer comprising a magnetic material, and the core body is composed of a non-magnetic metal. In addition, the present disclosure further comprises a shielding member embedded in the insulator and surrounding the spiral inductor circuits, wherein the shielding member is an arc-segment-shaped plate body or an arc-segment-shaped wall body arranged in a ring shape. Further, a composition of the shielding member comprises a magnetic material or a non-magnetic metal. Alternatively, a partial surface of the shielding member is provided with a magnetic layer comprising a magnetic material, and the shielding member is composed of a non-magnetic metal.

In the aforementioned two kinds of the electronic packages, the magnetic material is at least one of iron (Fe), nickel (Ni), cobalt (Co), manganese (Mn), zinc (Zn), or a combination thereof.

In the aforementioned two kinds of the electronic packages, the present disclosure further comprises an encapsulation layer encapsulating the electronic element.

As can be understood from the above, in the electronic package according to the present disclosure, the electronic package can withstand high current load and cover the inductor circuits due to the design of the fan-out conductive copper pillars and the shielding layers, so as to achieve the requirements of high current products and improve the inductance value and quality factor. Therefore, compared with the prior art, the inductor structure of the present disclosure can meet the requirements without using the mixture of the conventional magnetic member and the conventional magnetic powder, thereby overcoming various deficiencies of the prior art.

BRIEF DESCRIPTION OF THE DRAWINGS

FIG. 2D-1 is a schematic top plan view of one of the shielding layers of FIG. 2A.

FIG. 2D-2 to FIG. 2D-6 are schematic top plan views of other aspects of FIG. 2D-1.

FIG. 3B-1 is a schematic top plan view of one of the coils of one of the inductor circuits of FIG. 3A.

FIG. 3B-2 is a schematic top plan view of another coil of one of the inductor circuits of FIG. 3A.

FIG. 3B-3 is a schematic top plan view of one of the coils of another inductor circuit of FIG. 3A.

FIG. 3B-4 is a schematic top plan view of another coil of another inductor circuit of FIG. 3A.

FIG. 3C-1 is a schematic top plan view of one of the shielding layers of FIG. 3A.

FIG. 3C-2 is a schematic top plan view of another shielding layer of FIG. 3A.

FIG. 5A to FIG. 5C-1 are schematic cross-sectional views illustrating a method for fabricating the electronic package according to the first embodiment of the present disclosure.

FIG. 5C-2 is a schematic cross-sectional view of another aspect of FIG. 5C-1.

FIG. 6A, FIG. 6B, FIG. 6C, FIG. 6D-1 and FIG. 6E are schematic cross-sectional views illustrating a method for fabricating the electronic package according to the second embodiment of the present disclosure.

FIG. 6D-2 is a schematic cross-sectional view of another aspect of FIG. 6D-1.

DETAILED DESCRIPTION

Figure 1:
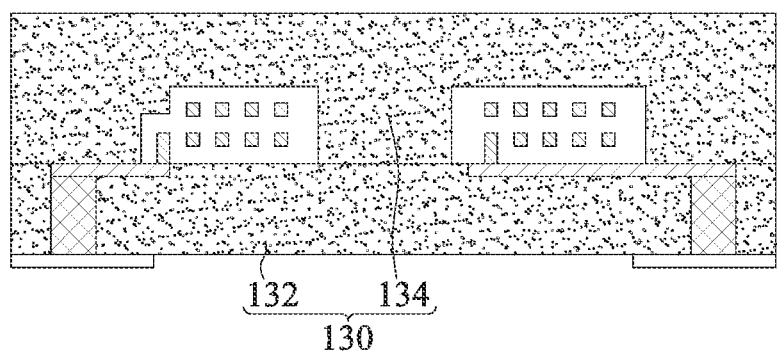
FIG. 1 is a schematic cross-sectional view of a conventional package substrate.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as fall within the scope covered by the technical contents disclosed herein. Meanwhile, terms such as "above," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

Figure 2A:
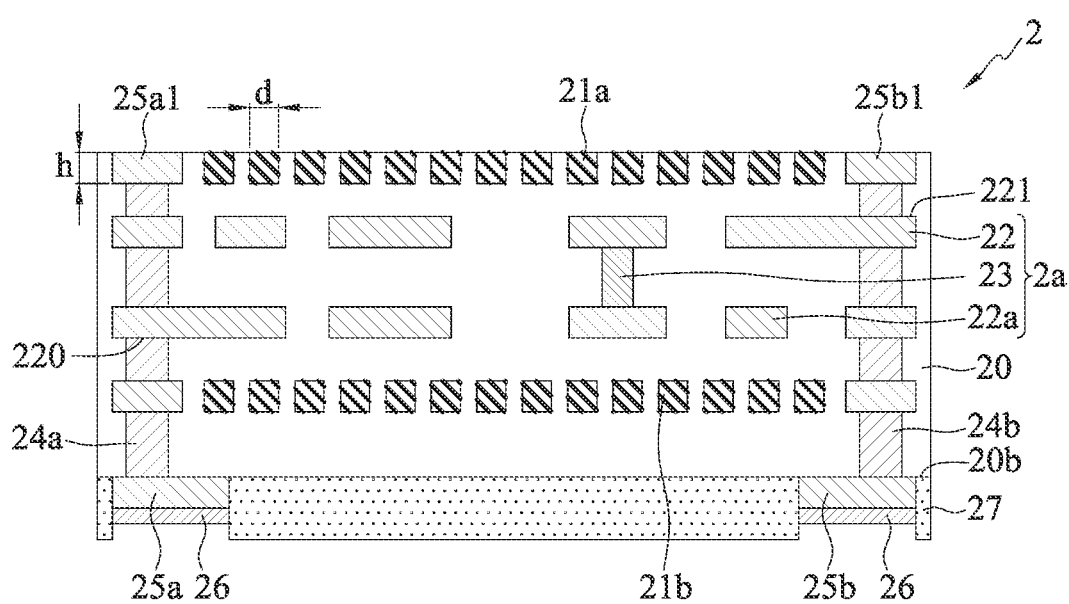
FIG. 2A is a schematic cross-sectional view of an inductor structure used in an electronic package according to a first embodiment of the present disclosure.

FIG. 2A is a schematic cross-sectional view of an inductor structure 2 used in an electronic package according to a first embodiment of the present disclosure. As shown in FIG. 2A, the inductor structure 2 comprises an insulator 20, an inductor body 2a embedded in the insulator 20, at least one shielding layer 21a, and at least one shielding layer 21b. The inductor body 2a comprises a plurality of layers of inductor circuits 22, 22a (e.g., two layers) and at least one conductor 23.

The insulator 20 has a first side 20a and a second side 20b opposing the first side 20a. In an embodiment, the insulator 20 is a dielectric material, such as Ajinomoto build-up film (ABF), photosensitive resin, polyimide (PI), bismaleimide triazine (BT), FR5 prepreg (PP), molding compound (e.g., molding resin), molded epoxy resin (e.g., epoxy molding compound [EMC]), or other suitable materials. The preferred material of the insulator 20 is PI, ABF, or EMC, which is easy to implement circuit processing.

Figure 2B:
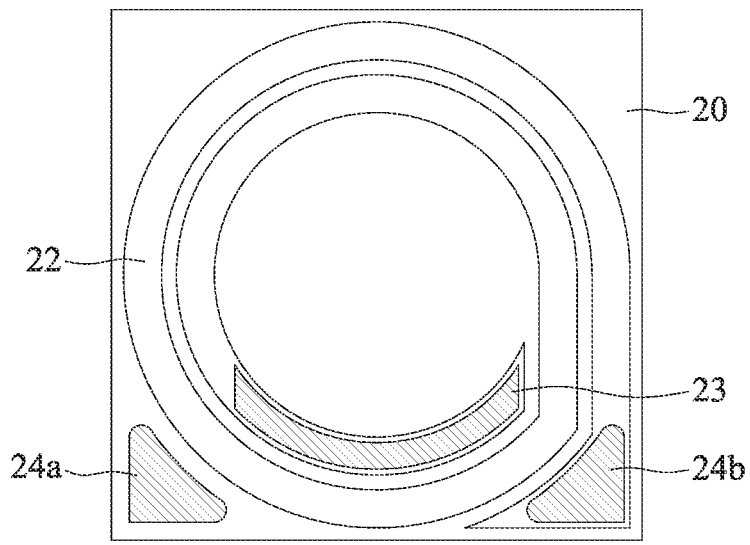
FIG. 2B is a schematic top plan view of one of the inductor circuits of FIG. 2A.
Figure 2C:
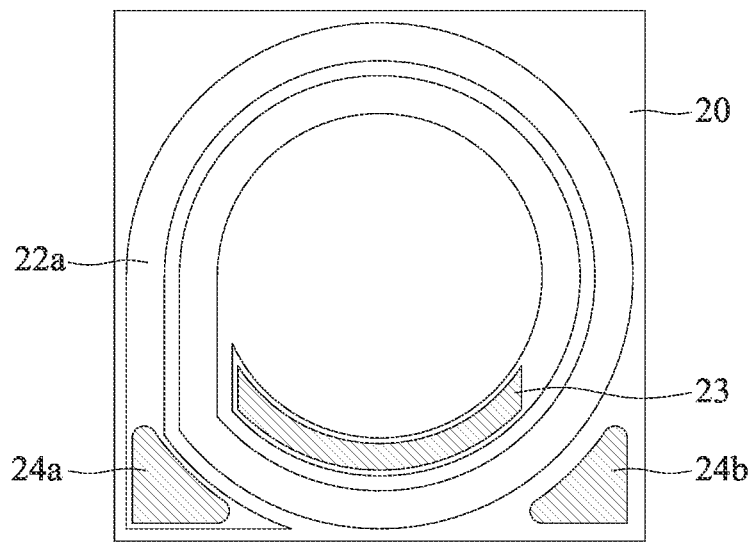
FIG. 2C is a schematic top plan view of another inductor circuit of FIG. 2A.

The inductor circuits 22, 22a are a single copper spiral coil, and the number of turns of the single spiral coil can be designed according to requirements, such as two turns shown in FIG. 2B and FIG. 2C.

In an embodiment, two contacts 220, 221 of the inductor body 2a are located at outer ends of the two inductor circuits 22, 22a, respectively, to serve as an input port and an output port. For example, a first conductive pillar 24a and a second conductive pillar 24b are embedded in the insulator 20, so that the first conductive pillar 24a is connected to the first side 20a of the insulator 20 and one of the inductor circuits 22a and is connected to one of the contacts 220, and the second conductive pillar 24b is connected to the first side 20a and the second side 20b of the insulator 20 and is connected to another inductor circuit 22 to connect to another contact 221.

Further, an end surface of the first conductive pillar 24a is connected to a first electrical connecting pad 25a disposed on the second side 20b of the insulator 20, and an end surface of the second conductive pillar 24b is connected to a second electrical connecting pad 25b disposed on the second side 20b of the insulator 20, so that the first and second electrical connecting pads 25a, 25b are used to connect to other electronic elements. The first and second electrical connecting pads 25a, 25b can be disposed on one side or both sides (e.g., electrical connecting pads 25a1, 25b1 as shown), wherein the first conductive pillar 24a and the second conductive pillar 24b are solid irregular columns, as shown in FIG. 2B and FIG. 2C, so as to contact the first and second electrical connecting pads 25a, 25b with more areas, thereby obtaining the largest conduction area.

In addition, a surface treatment layer 26 can be formed on the first and second electrical connecting pads 25a, 25b to facilitate the connection with other electronic elements, wherein the material for forming the surface treatment layer 26 is nickel/gold (Ni/Au), nickel/palladium/gold (Ni/Pd/Au), solder material, or organic solderability preservative (OSP), etc. For example, an insulating protective layer 27 may be formed on the second side 20b of the insulator 20, and expose the first and second electrical connecting pads 25a, 25b or the surface treatment layer 26 thereon, wherein the material for forming the insulating protective layer 27 is a dielectric material, a photosensitive or non-photosensitive organic insulating material, such as solder resist, ABF and EMC. In one embodiment, the insulating protective layer 27 and the insulator 20 can be made of the same material, and the material combination can be simplified. It should be understood that the insulating protective layer 27 and the insulator 20 can also be made of different materials.

The inductor circuits 22, 22a are stacked on the conductor 23, so that the conductor 23 is located between the inductor circuits 22, 22a, and the inductor body 2a is in the form of an aspect of a longitudinal annular three-dimensional spiral coil.

In an embodiment, the conductor 23 corresponds to the shape of each of the inductor circuits 22, 22a. For example, as shown in FIG. 2B and FIG. 2C, the conductor 23 is an arc-shaped sheet body or an arc-shaped wall body. Compared with the conventional method of using a laser to open a conductive blind via or a through hole of a circular hole, the present disclosure can meet the requirement of contacting the two inductor circuits 22, 22a with a large area.

Figures 1, 2D:
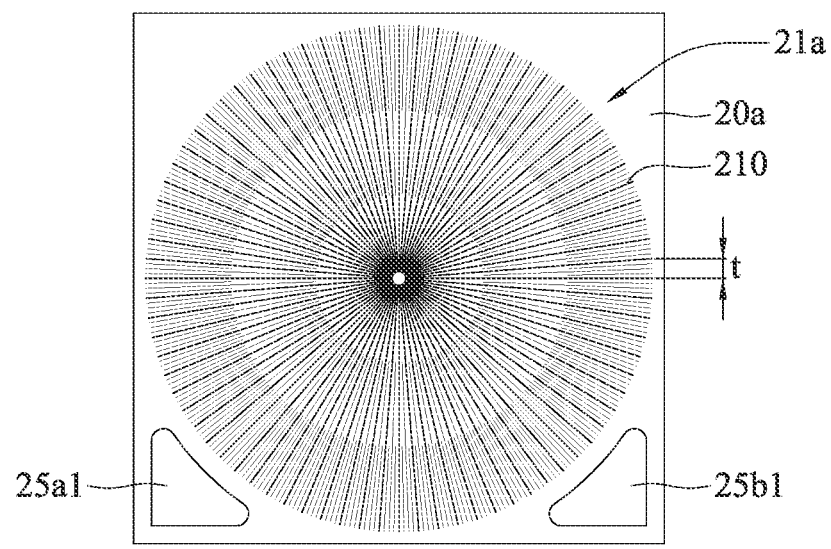
Figures 2, 2D:
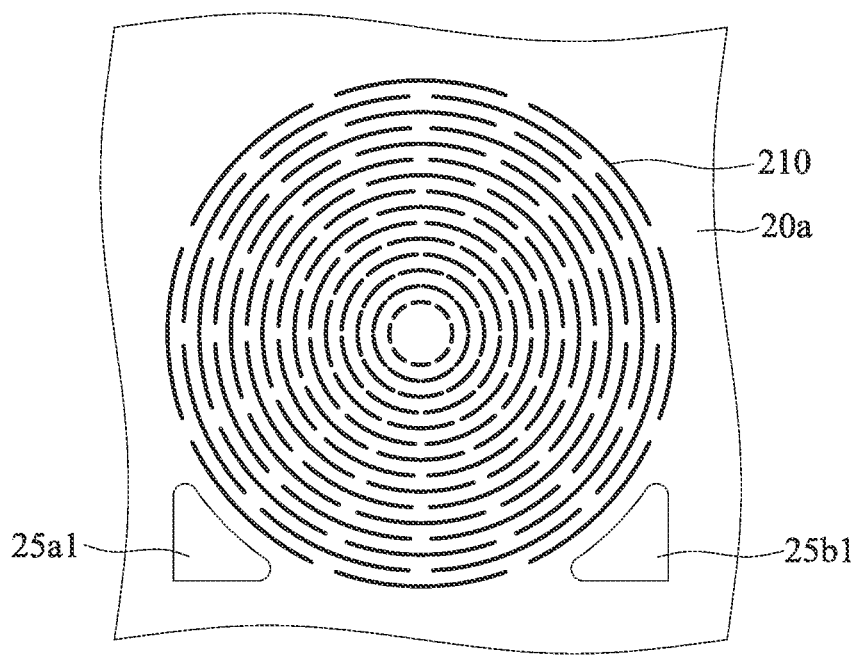
Figures 2, 2D, 3:
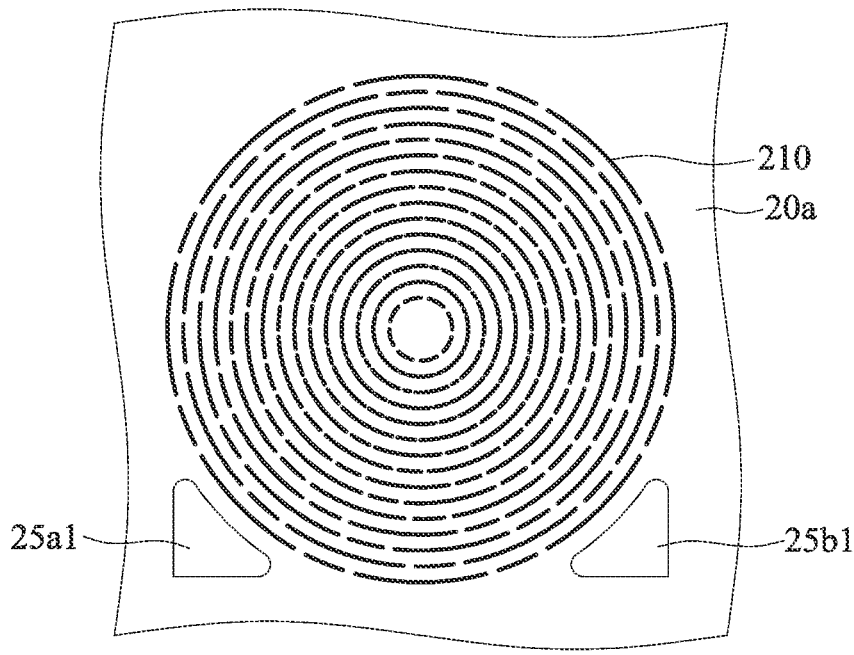
Figures 2, 2D, 3, 4:
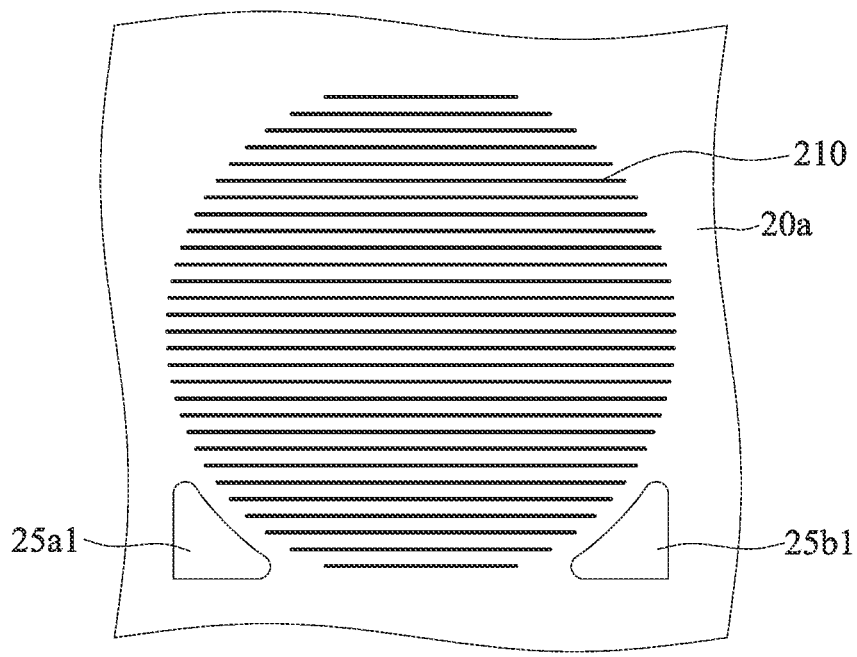
Figures 2, 2D, 3, 4, 5:
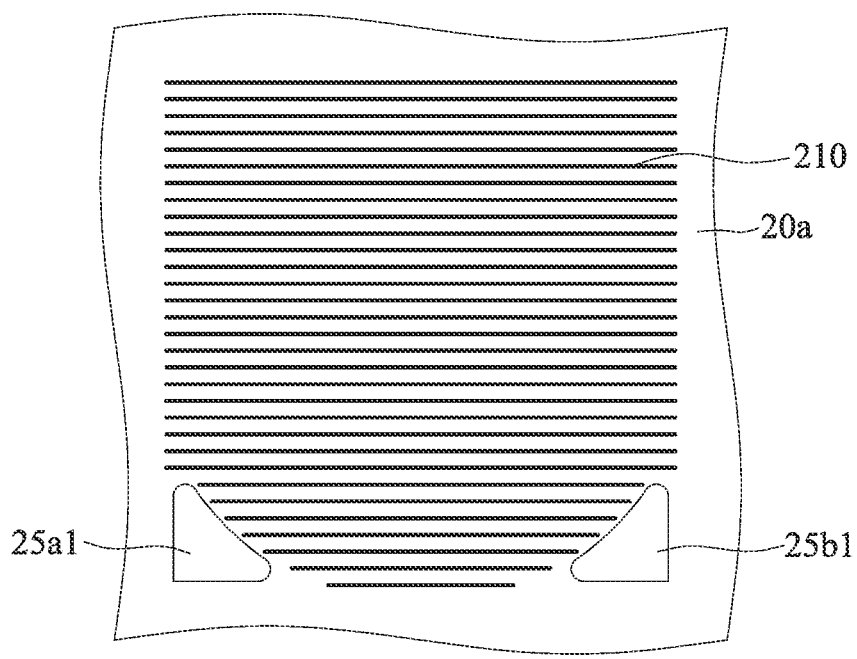
Figures 2, 2D, 3, 4, 5, 6:
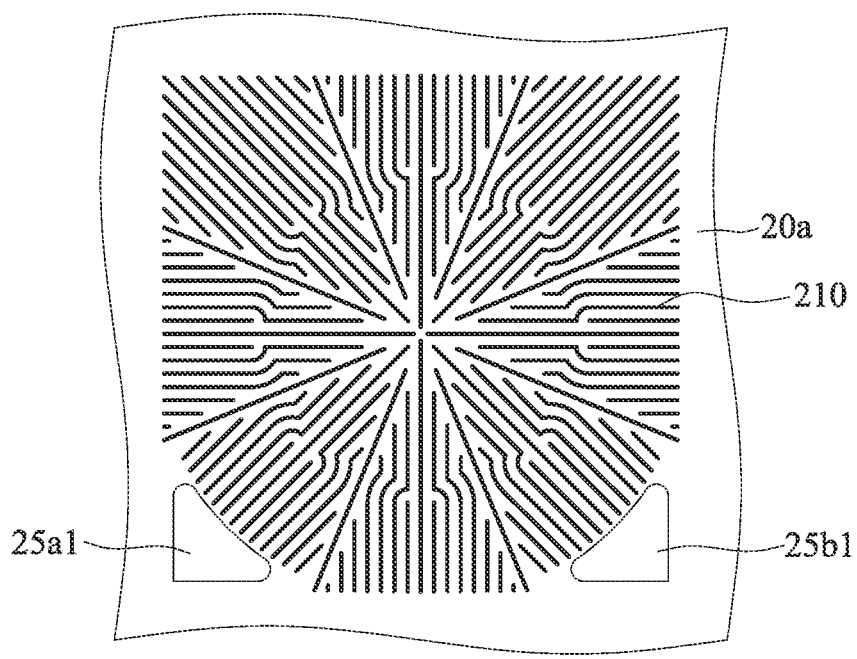
Figure 2E:
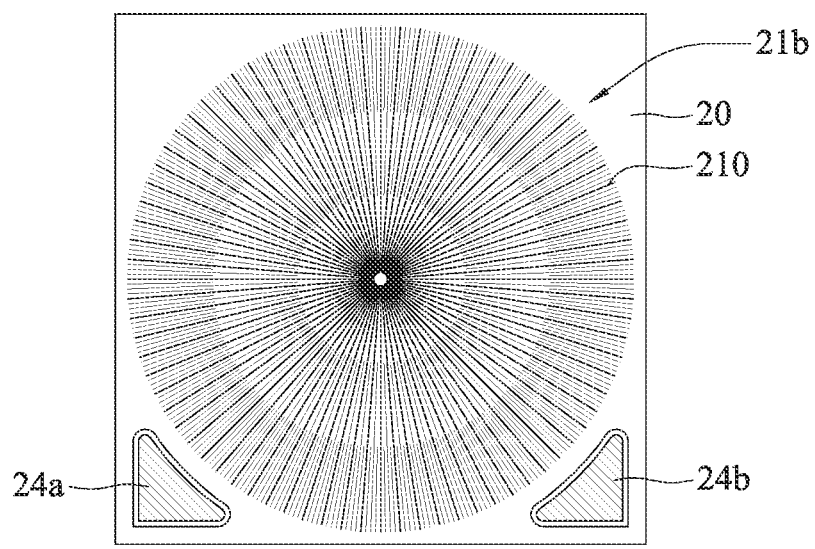
FIG. 2E is a schematic top plan view of another shielding layer of FIG. 2A.

The shielding layers 21a, 21b are embedded in the first side 20a and the second side 20b of the insulator 20, respectively, so as to be arranged on the upper and lower sides of the inductor body 2a to shield the inductor circuits 22, 22a, and the shielding layers 21a, 21b are free from being electrically connected to the inductor body 2a (or the inductor circuits 22, 22a), wherein the shielding layers 21a, 21b comprise a plurality of line segments 210 that are free from being connected to each other (as shown in FIG. 2D-1 and FIG. 2E), and a distance t between each of the line segments 210 may or may not be the same.

In an embodiment, the shielding layers 21a, 21b are formed by electroplating, sputtering, or physical vapor deposition (PVD), and the line segments 210 are arranged in a pattern of a circular outline (as shown in FIG. 2D-1 and FIG. 2E), a polygonal outline, or other outlines, which can be in a radial shape (as shown in FIG. 2D-1 and FIG. 2E), a polycyclic shape (as shown in FIG. 2D-2), or other shapes. It should be understood that the shape of each of the line segments 210 can be a line shape (the line segments 210 shown in FIG. 2D-4 or FIG. 2D-5) or a sector/fan shape (line segments 310 shown in FIG. 3C-1 or FIG. 3C-2), and the pattern can be symmetrical (as shown in FIG. 2D-2 or FIG. 2D-6) or asymmetrical (as shown in FIG. 2D-3).

Further, the shielding layers 21a, 21b are magnetic materials (e.g., magnetic conductive materials), which comprise iron (Fe), nickel (Ni), cobalt (Co), manganese (Mn), zinc (Zn), or alloys thereof, or other magnetic materials. In addition, the shielding layers 21a, 21b can also be formed by combining a magnetic material with a non-magnetic metal such as copper (Cu). For example, copper (Cu) is electroplated or chemical plated first and then the magnetic material is plated, or the magnetic layer is plated first and then the non-magnetic metal is plated.

Also, the shielding layer 21a may be exposed from the first side 20a of the insulator 20, and another insulating protective layer (not shown) is formed on the first side 20a of the insulator 20 to cover the shielding layer 21a. For example, the material for forming the insulating protective layer is a dielectric material, a photosensitive or non-photosensitive organic insulating material, such as solder resist, ABF and EMC, but not limited to the above. In addition, the insulating protective layer (not shown) on the first side 20a of the insulator 20 and the insulator 20 can be made of the same material or different materials, and the material combination can be simplified when the insulating protective layer and the insulator 20 are made of the same material.

Therefore, in the inductor structure 2 of the present disclosure, the shielding layer 21a, 21b having a magnetic material is formed on at least one side of the opposite sides of the inductor body 2a (or the multilayer inductor circuits 22, 22a) to cover the inductor circuits 22, 22a. It is preferable to form a set of the opposite shielding layers 21a, 21b, so as to reduce the effect of electromagnetic interference and increase the ability of resisting the effect of electromagnetic interference, thereby improving the inductance value and quality factor (or the Q value of the inductor, i.e., $\omega L/R$, where $\omega$ represents the frequency, L represents the inductance, and R represents the resistance of the inductor). For example, the shielding layers 21a, 21b are used to form the plurality of line segments 210 of a pattern (a line width d of which can be adjusted according to design requirements, as shown in FIG. 2A), wherein the thinner the line width d (as shown in FIG. 2A) the better, so as to reduce the eddy current.

In addition, the shielding layers 21a, 21b can be selected from magnetic materials that meet the magnetic permeability conditions according to the requirements of the inductance value.

Also, in order to improve the Q value, the conductor 23 can be formed by lithography patterned electroplating metal posts for the conductive connection between the layers of the inductor circuits 22, 22a, where the shape of the conductor 23 corresponds to the arc shape of the inductor circuits 22, 22a, so as to obtain a wider conductive area, reduce the resistance R of the inductor and obtain higher thermal conductivity.

Figure 3A:
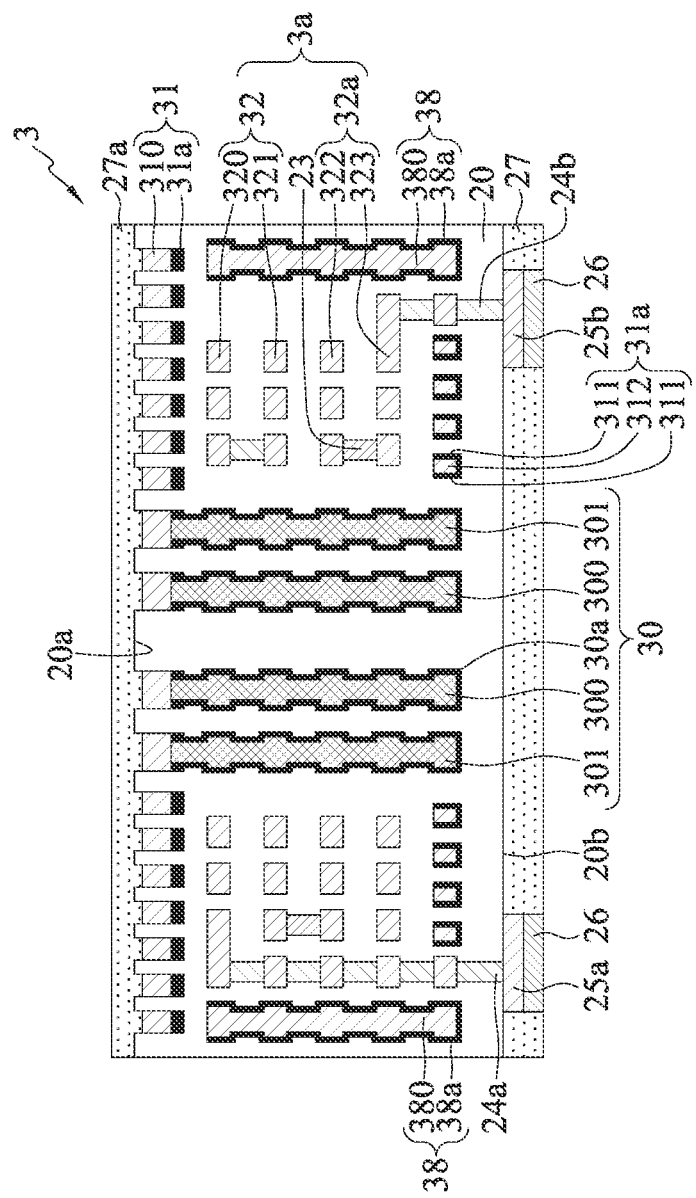
FIG. 3A is a schematic cross-sectional view of an inductor structure used in an electronic package according to a second embodiment of the present disclosure.

FIG. 3A is a schematic cross-sectional view of an inductor structure 3 used in an electronic package according to a second embodiment of the present disclosure. The main difference between the second embodiment and the first embodiment is the addition of a core body, and the other structures are roughly the same, so similarities between the two will not be repeated.

As shown in FIG. 3A, the inductor structure 3 further comprises a core body 30 embedded in the insulator 20, so that an inductor body 3a surrounds the core body 30, and the core body 30 can be connected to shielding layers 31, 31a (as shown in FIG. 3A) or not connected to the shielding layers 31, 31a (not shown) according to requirements, and the core body 30 is not in contact with the inductor body 3a.

In an embodiment, the core body 30 comprises at least one hollow annular conductive pillar 300, at least one hollow annular conductive pillar 301 (the conductive pillars 300, 301 can also be solid conductive pillars) and magnetic portions 30a formed on the wall surfaces of the annular conductive pillars 300, 301, so that the core body 30 becomes a magnetic core element of the inductor structure 3. For example, the annular conductive pillars 300, 301 are made of copper material formed in the insulator 20 by electroplating, sputtering, deposition, or other methods, and a magnetic material such as at least one of iron (Fe), nickel (Ni), cobalt (Co), manganese (Mn), zinc (Zn), or a combination thereof is formed on a wall surface of at least one side of the annular conductive pillars 300, 301 by electroplating, sputtering, deposition, or other methods, so as to form the magnetic portion 30a. In one embodiment, the magnetic portions 30a can also be formed on both sidewalls of the annular conductive pillars 300, 301 to improve inductance.

Figures 1, 3B:
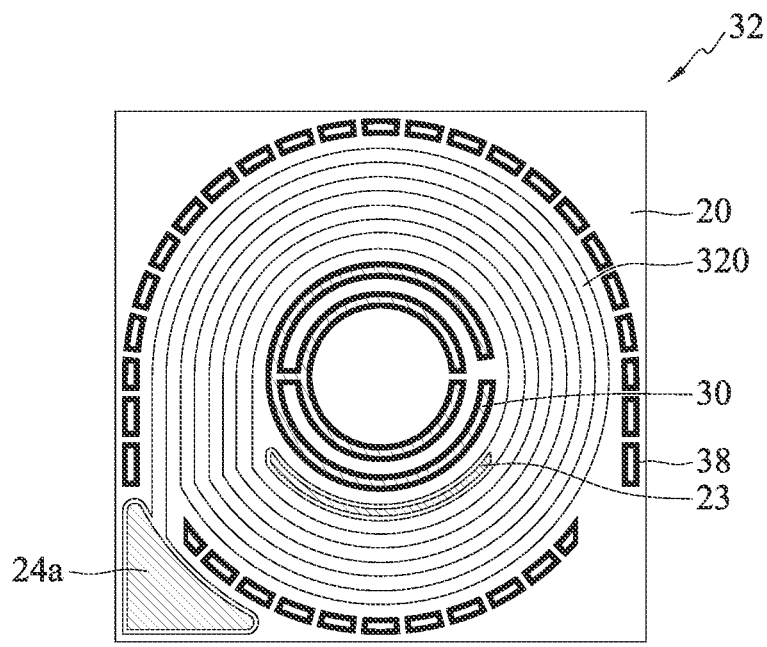
Figures 2, 3B:
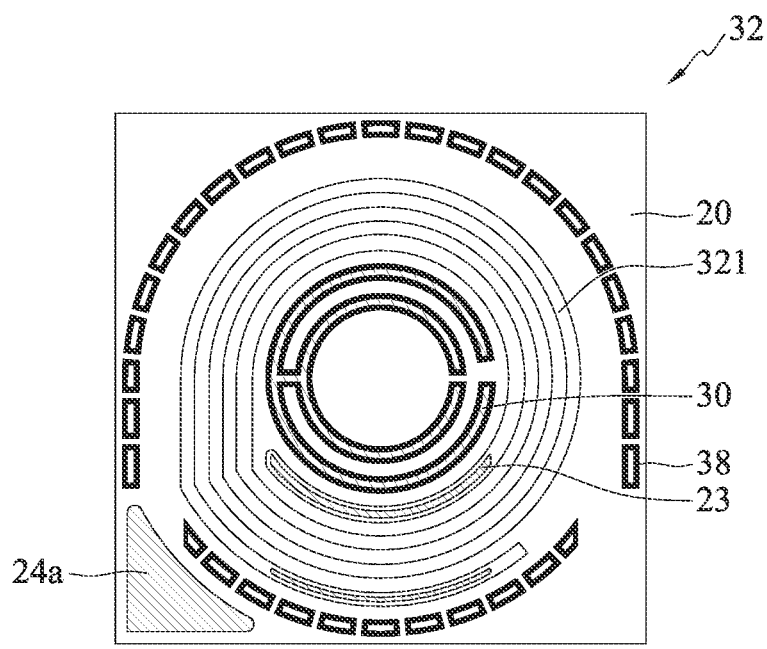
Figures 3, 3B:
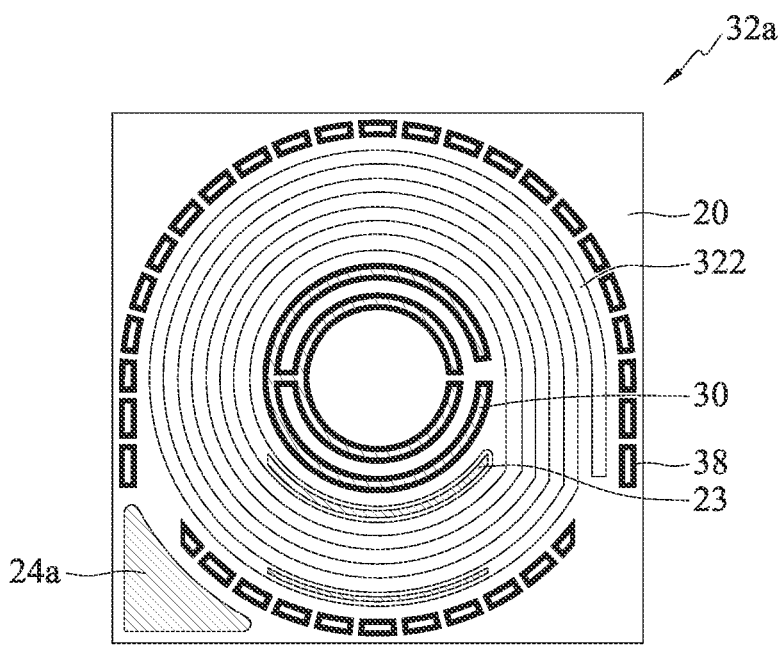
Figures 3, 3B, 4:
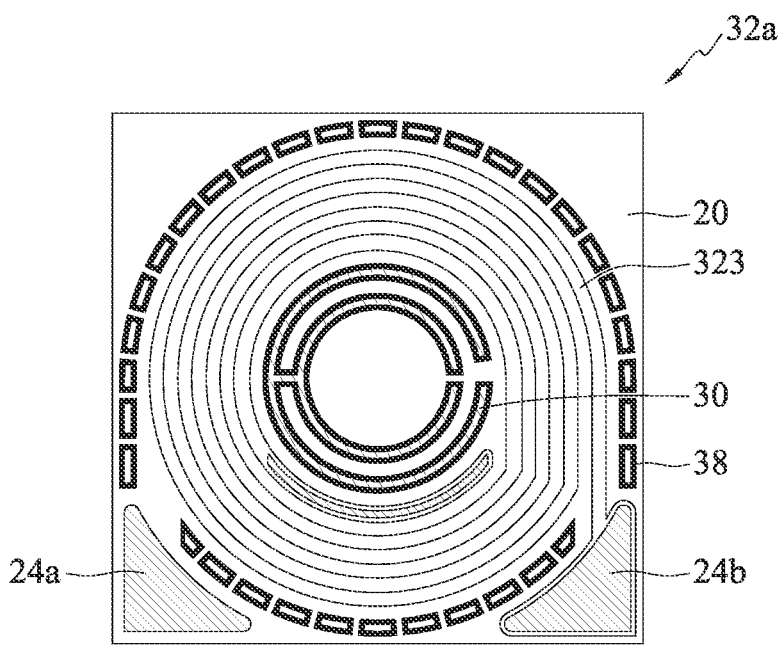
Figures 1, 3C:
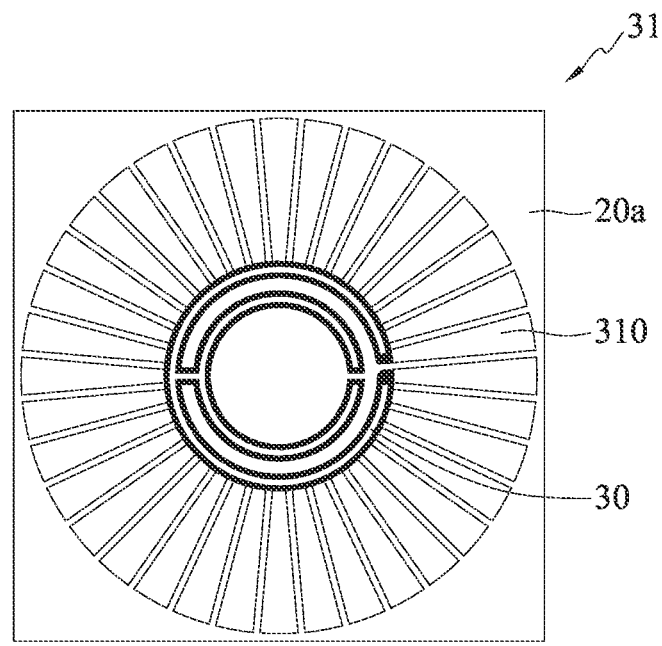
Figures 2, 3C:
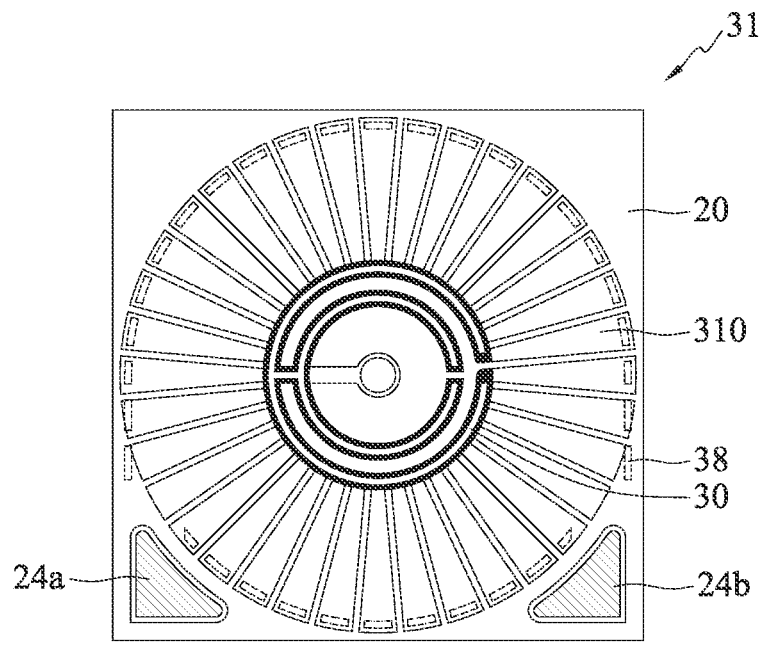

Further, inductor circuits 32, 32a are composed of multi-layer copper spiral coils 320, 321, 322, 323, for example, the number of turns of each layer of coils is four (as shown in FIG. 3B-1). For instance, two layers of sheet-coils 321, 322 (e.g., four layers of sheet-coils 320, 321, 322, 323 as shown in FIG. 3B-1 to FIG. 3B-4) and one layer of wall-shaped conductor 23 are stacked on top of each other.

Also, the configuration of the shielding layers 31, 31a can correspond to the configuration of the core body 30 according to requirements, that is, the configuration of the two is the same. For example, the shielding layers 31, 31a comprise a conductive portion 312 and the magnetic portion 30a formed on the conductive portion 312, and the conductive portion 312 is not electrically connected to the inductor circuits 32, 32a, wherein the conductive portion 312 is formed by forming a copper layer in the insulator 20 by electroplating, sputtering, deposition, or other methods, and a magnetic material such as at least one of iron (Fe), nickel (Ni), cobalt (Co), manganese (Mn), zinc (Zn), or a combination thereof is formed on a surface of at least one side of the conductive portion 312 by electroplating, sputtering, deposition, or other methods, so as to form the magnetic portion 30a.

Further, a ring-shaped shielding member 38 can be embedded in the insulator 20 of the inductor structure 3 according to requirements, so that the shielding member 38 surrounds the inductor body 3a. For example, the configuration of the shielding member 38 can correspond to the configuration of the shielding layers 31, 31a (or the core body 30) according to requirements, that is, the configuration of the two is the same, wherein the shielding member 38 comprises a conductive portion 380 and a magnetic portion 38a formed on the conductive portion 380, and the conductive portion 380 is formed by forming a copper material in the insulator 20 by electroplating, sputtering, deposition, or other methods, and a magnetic material such as at least one of iron (Fe), nickel (Ni), cobalt (Co), manganese (Mn), zinc (Zn), or a combination thereof is formed on a surface of at least one side of the conductive portion 380 by electroplating, sputtering, deposition, or other methods, so as to form the magnetic portion 38a.

Therefore, the shielding layers 31, 31a of the inductor structure 3 of the present disclosure may have the magnetic portion 30a formed on the patterned copper layer (the conductive portion 312), where the core body 30 is disposed in the coils 320, 321, 322 of the inductor circuits 32, 32a, and the magnetic portion 30a is formed on the surface of the core body 30 as a magnetic core element, so as to increase the inductance value of the inductor structure 3.

Further, a magnetic material can also be formed on the conductor 23 according to requirements, so as to improve the electrical characteristics of the inductor structure 3.

Also, the magnetic portions 30a, 311, 38a are arranged around the inductor circuits 32, 32a, so as to provide a good electromagnetic shielding effect on the inductor body 2a, 3a, and a copper material with good conductivity is used as the conductive layer (i.e., the inductor body 3a), in order to obtain the lowest inductance resistance R. Therefore, the inductor structure 3 of the embodiment can obtain better Q value and electrical characteristics than the inductor structure 2 of the first embodiment.

In addition, another insulating protective layer 27a may be formed on the shielding layer 31a (or on the first side 20a of the insulator 20) to cover the shielding layer 21a.

FIG. 4A to FIG. 4G are schematic cross-sectional views illustrating a method of fabricating the inductor structure of FIG. 2A. In an embodiment, according to the inductor structure 2 of the first embodiment, the manufacturing method of the inductor structure 2 adopts the manufacturing method of the circuit structure in the packaging substrate manufacturing process, such as the patterned build-up circuit manufacturing method in an aspect of coreless.

Figure 4A:
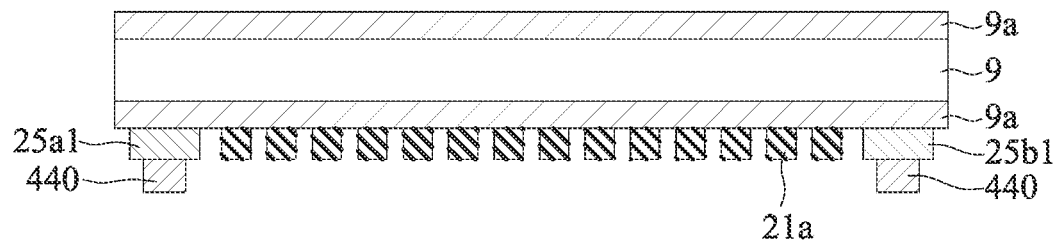
FIG. 4A to FIG. 4G are schematic cross-sectional views illustrating a manufacturing method of FIG. 2A.

As shown in FIG. 4A, the shielding layer 21a, the electrical connecting pads 25a1, 25b1 and pillars 440 made of copper are formed on a carrier 9 by a large-panel process.

In an embodiment, the carrier 9 is a substrate material, such as a copper foil substrate, but is not limited to as such. The embodiment uses a copper foil substrate as an illustration, with copper-containing metal materials 9a on both sides of the carrier 9.

Furthermore, the shielding layer 21a, the electrical connecting pads 25a1, 25b1 and the copper pillars 440 can be formed by electroplating, sputtering, physical vapor deposition (PVD), etc.

Figure 4B:
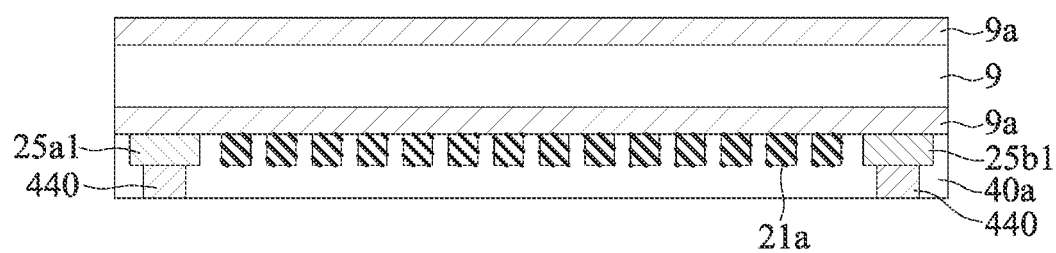

As shown in FIG. 4B, a first insulating layer 40a is formed on the carrier 9 to cover the shielding layer 21a, the electrical connecting pads 25a1, 25b1 and the pillars 440, and the pillars 440 are exposed from the first insulating layer 40a for electrically connecting with other build-up circuits subsequently.

Figure 4C:
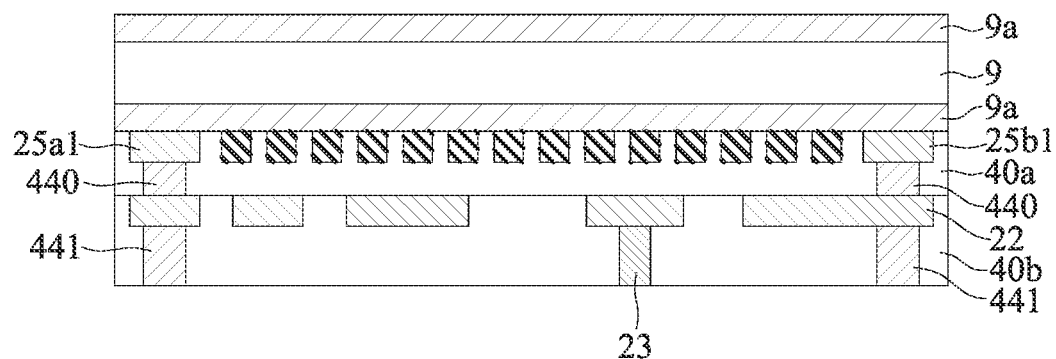

As shown in FIG. 4C, the copper inductor circuit 22 is formed on the first insulating layer 40a, and the inductor circuit 22 is in contact with the exposed surface of the pillars 440, then the copper conductor 23 and pillars 441 made of copper are formed on the inductor circuit 22, such that the positions of the pillars 441 correspond to the positions of the pillars 440. Next, a second insulating layer 40b is formed on the first insulating layer 40a to cover the inductor circuit 22, the conductor 23 and the pillars 441, and the inductor circuit 22, the conductor 23 and the pillars 441 are exposed from the second insulating layer 40b for electrically connecting with other build-up circuits subsequently.

In an embodiment, the inductor circuit 22, the conductor 23 and the pillars 441 may be manufactured by electroplating, sputtering, or physical vapor deposition (PVD), etc.

Figure 4D:
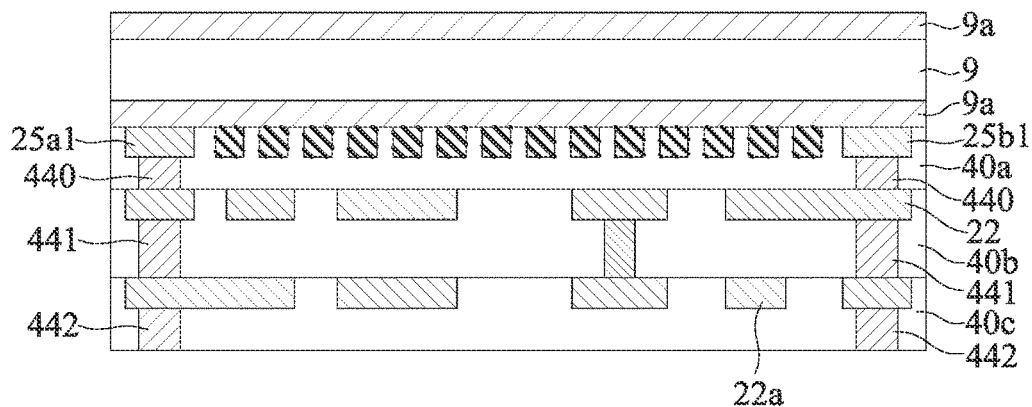

As shown in FIG. 4D, another copper inductor circuit 22a is formed on the second insulating layer 40b, and the inductor circuit 22a is in contact with the exposed surface of the conductor 23, and a plurality of pillars 442 made of copper are formed on the inductor circuit 22a, such that the positions of the pillars 442 correspond to the positions of the pillars 441. Next, a third insulating layer 40c is formed on the second insulating layer 40b to cover the inductor circuit 22a and the plurality of pillars 442, and the inductor circuit 22a and the plurality of pillars 442 are exposed from the third insulating layer 40c for electrically connecting with other build-up circuits subsequently.

In an embodiment, the inductor circuit 22a and the pillars 442 may be manufactured by electroplating, sputtering, or physical vapor deposition (PVD), etc.

Figure 4E:
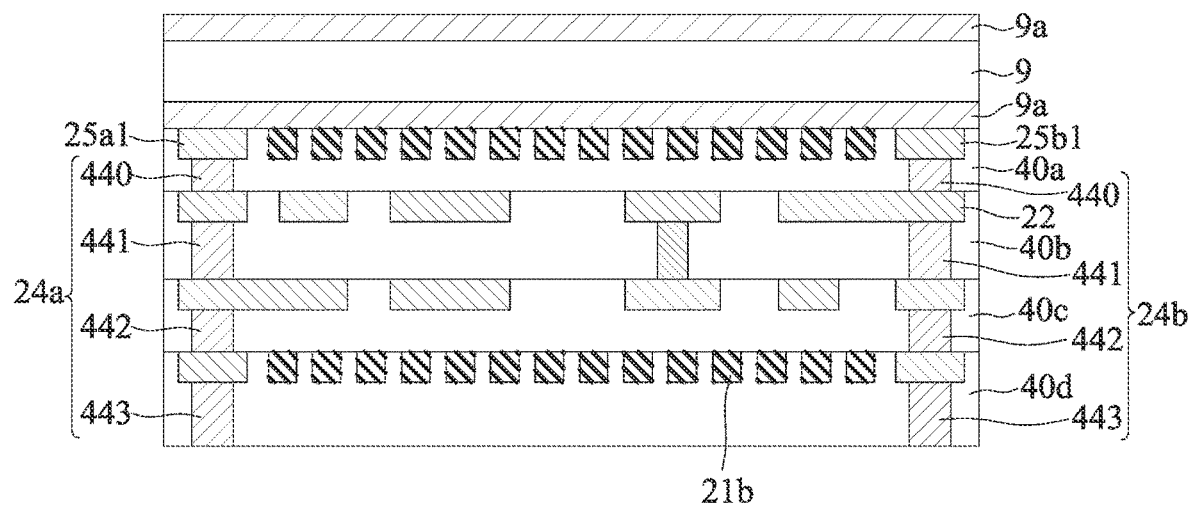

As shown in FIG. 4E, another shielding layer 21b and a plurality of pillars 443 made of copper are formed on the third insulating layer 40c, and the plurality of pillars 443 are in contact with the exposed surfaces of the plurality of pillars 442, such that the positions of the plurality of pillars 443 are respectively corresponding to the positions of the plurality of pillars 442, so that the pillars 440, 441, 442, 443 corresponding to the electrical connecting pad 25a1 serve as the first conductive pillar 24a, and the pillars 440, 441, 442, 443 corresponding to the electrical connecting pad 25b1 serve as the second conductive pillar 24b. Next, a fourth insulating layer 40d is formed on the third insulating layer 40c to cover the other shielding layer 21b and the plurality of pillars 443, so that the first to fourth insulating layers 40a, 40b, 40c, 40d serve as the insulator 20, and ends of the first and second conductive pillars 24a, 24b are exposed from the fourth insulating layer 40d for electrically connecting with other build-up circuits subsequently.

In an embodiment, another shielding layer 21b and the pillars 443 can be manufactured by electroplating, sputtering, or physical vapor deposition (PVD), etc.

Figure 4F:
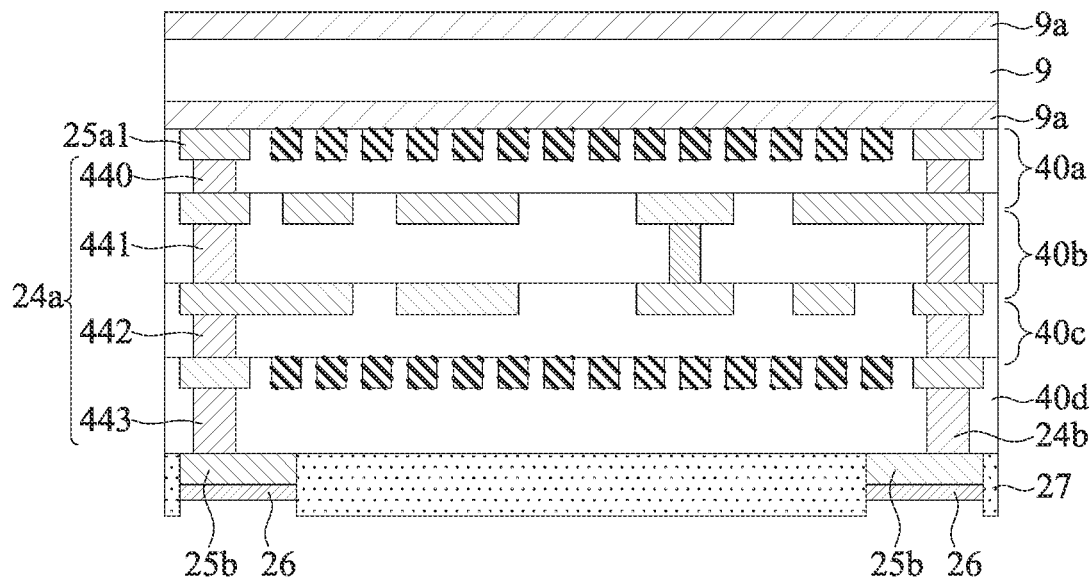

As shown in FIG. 4F, a plurality of electrical connecting pads made of copper (i.e., the first and second electrical connecting pads 25a, 25b) are formed on the fourth insulating layer 40d, and the first and second electrical connecting pads 25a, 25b are connected to the exposed surface of the first and second conductive pillars 24a, 24b, and then the insulating protective layer 27 is formed on the fourth insulating layer 40d and exposes the first and second electrical connecting pads 25a, 25b to form the surface treatment layer 26 for electrically connecting with other components.

In an embodiment, the first and second electrical connecting pads 25a, 25b may be manufactured by electroplating, sputtering, physical vapor deposition (PVD), or etching, etc.

Figure 4G:
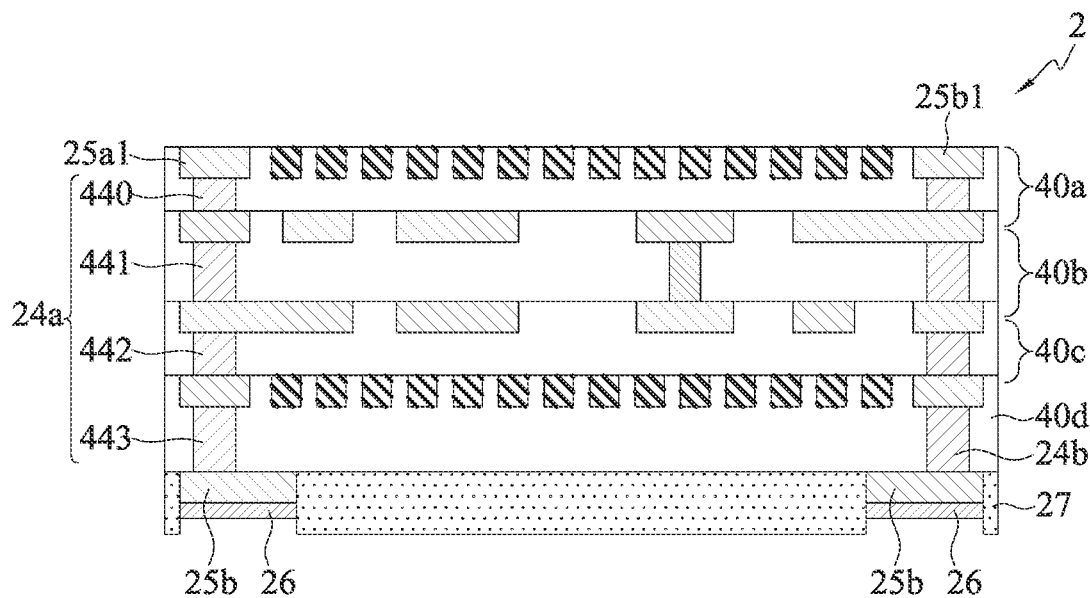

As shown in FIG. 4G, the carrier 9 is removed to expose the first side 20a of the insulator 20 and the electrical connecting pads 25a1, 25b1 for electrically connecting with other components; in addition, another insulating protective layer (not shown) can further be formed on the first side 20a of the insulator 20 to cover the shielding layer 21a.

In an embodiment, if the carrier 9 and its metal material 9a are removed by etching, partial material of the shielding layer 21a and the electrical connecting pads 25a1, 25b1 will be micro-etched, so that surfaces of the shielding layer 21a and the electrical connecting pads 25a1, 25b1 are slightly lower than the first side 20a of the insulator 20.

It should be understood that the process of the inductor structure 3 of the second embodiment can be completed by using a multi-layer patterning process. However, there are various methods for fabricating the inductor structure 2, 3 of the present disclosure, which are not limited to the above.

FIG. 5A to FIG. 5C-1 are schematic cross-sectional views illustrating a method for fabricating an electronic package 5 according to the first embodiment of the present disclosure. The manufacturing method of this embodiment is roughly the same as the above-mentioned manufacturing method, so the same points will not be repeated below.

Figure 5A:
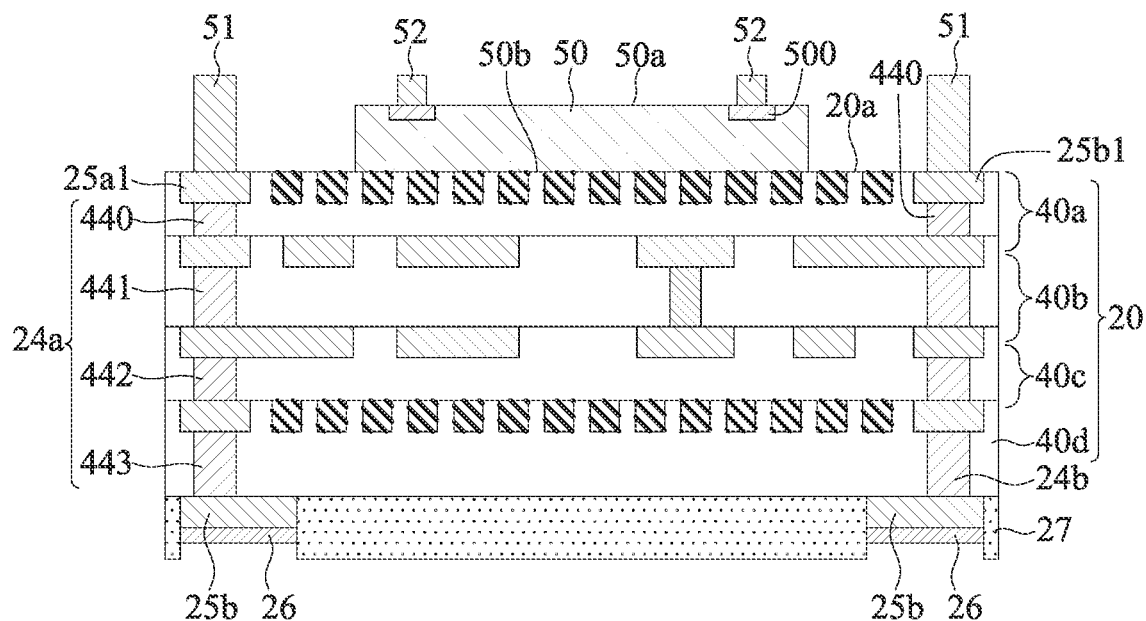

As shown in FIG. 5A, the subsequent electronic element packaging process for forming the inductor structure 2 is to configure at least one electronic element 50 on the first side 20a of the insulator 20 of the inductor structure 2 shown in FIG. 4G. And corresponding copper pillars 51 are formed on the electrical connecting pads 25a1, 25b1 of the inductor structure 2.

In an embodiment, the electronic element 50 is an active element, a passive element, or a combination of the active element and the passive element, wherein the active element is such as a semiconductor chip, and the passive element is such as a resistor, a capacitor, or an inductor. For example, the electronic element 50 is a semiconductor chip, which has an active surface 50a and an inactive surface 50b opposing the active surface 50a, where the active surface 50a has a plurality of electrode pads 500, the electronic element 50 is adherely bonded to the first side 20a of the insulator 20 by the inactive surface 50b, and the plurality of electrode pads 500 are fanned out and formed with corresponding conductive copper pillars 52.

In addition, the copper pillars 51 and the conductive copper pillars 52 may be formed by patterned electroplating, sputtering, physical vapor deposition (PVD), etc.

Figure 5B:
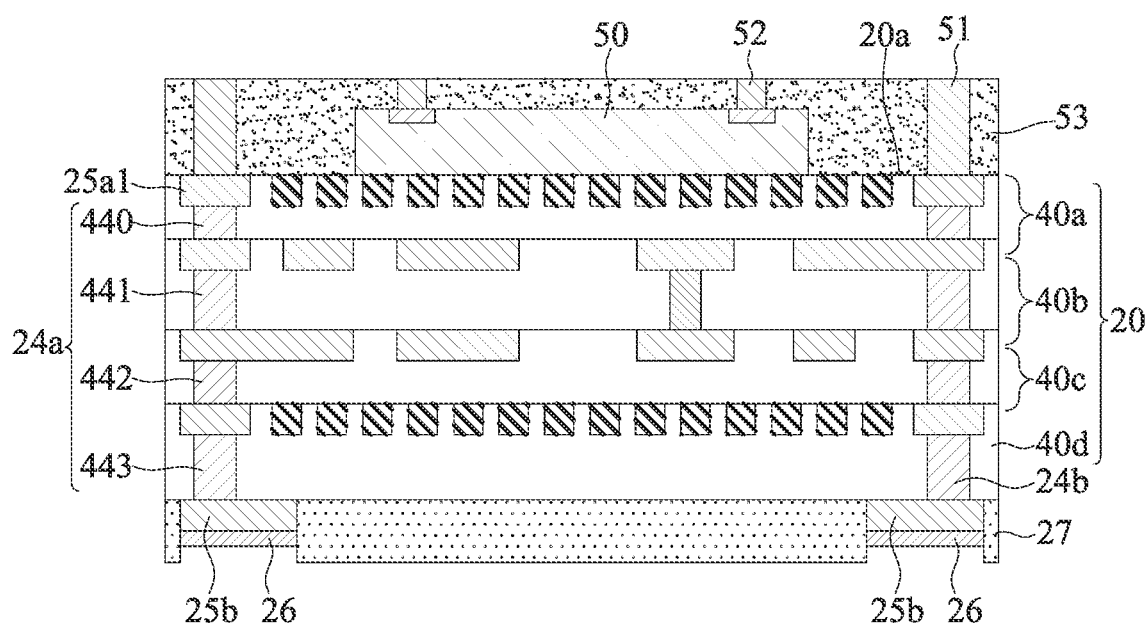

As shown in FIG. 5B, an encapsulation layer 53 is formed on the first side 20a of the insulator 20 of the inductor structure 2, so that the encapsulation layer 53 encapsulates the electronic element 50, the copper pillars 51 and the conductive copper pillars 52, and end surfaces of the copper pillars 51 and the conductive copper pillars 52 are exposed from the surface of the encapsulation layer 53 via a planarization process for electrically connecting with other build-up circuits subsequently.

In an embodiment, the encapsulation layer 53 is a dielectric material, such as Ajinomoto build-up film (ABF), photosensitive resin, polyimide (PI), bismaleimide triazine (BT), FR5 prepreg (PP), molding compound (e.g., molding resin), molded epoxy resin (e.g., epoxy molding compound

[EMC]), or other suitable materials. For example, the encapsulation layer 53 may be formed on the first side 20a of the insulator 20 by lamination or molding.

Figures 1, 5C:
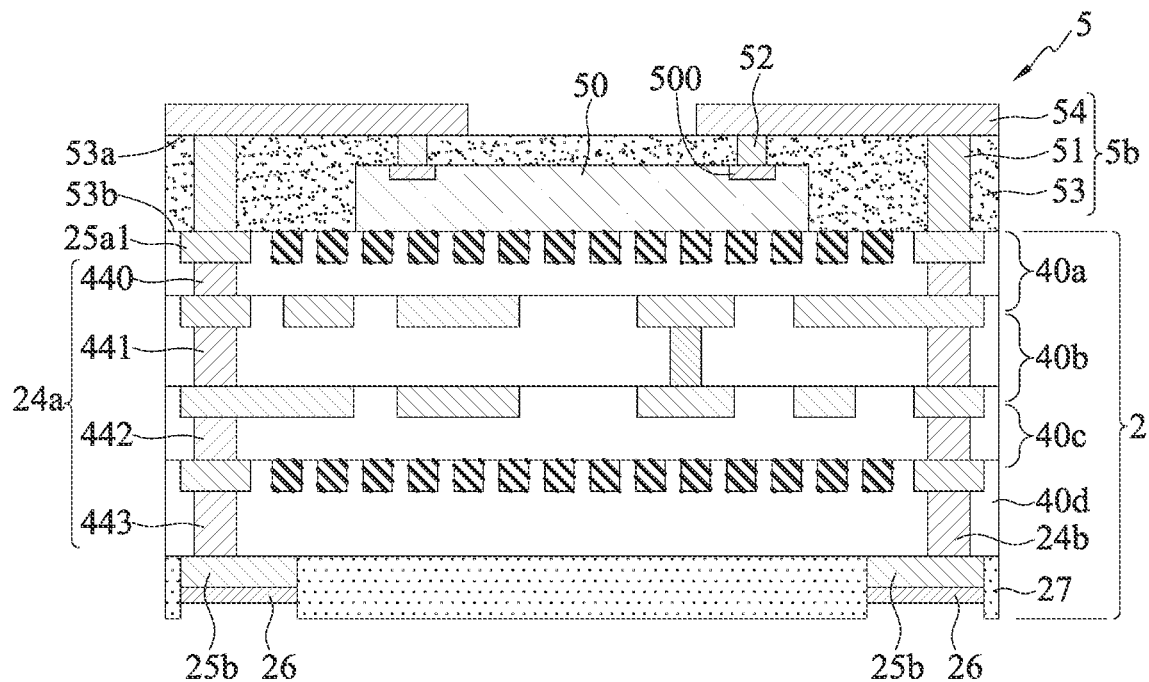
Figures 2, 5C:
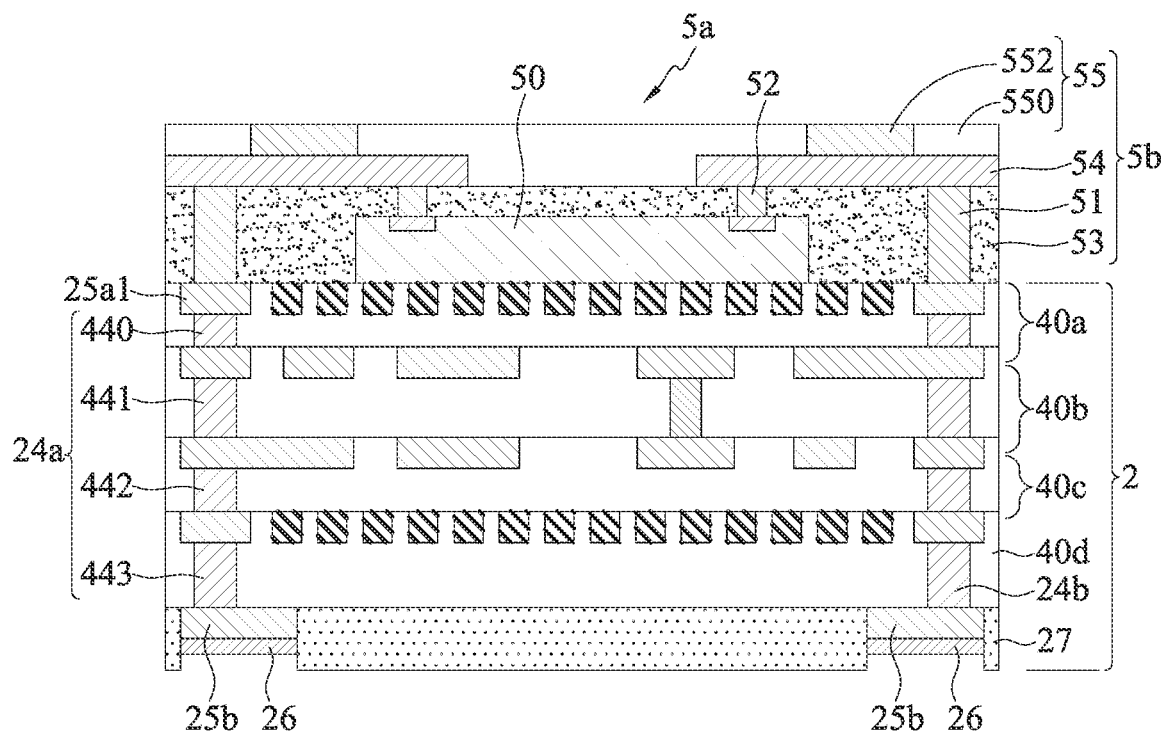

As shown in FIG. 5C-1, a first circuit layer 54 is formed on the encapsulation layer 53, so that the first circuit layer 54 is electrically connected to the copper pillars 51 and the conductive copper pillars 52.

In an embodiment, the first circuit layer 54 may be manufactured by electroplating, sputtering, physical vapor deposition (PVD), or etching, etc.

Also, a routing structure 55 can be formed on the encapsulation layer 53 and the first circuit layer 54 according to requirements, that is, an electronic package 5a as shown in FIG. 5C-2. For example, the routing structure 55 comprises a plurality of copper pillars 552 formed on the first circuit layer 54 and electrically connected to the first circuit layer 54 and a cladding layer 550 covered the first circuit layer 54 and the copper pillars 552. And the end surfaces of the copper pillars 552 are exposed from the cladding layer 550 by a planarization process, so as to be used as an external port, wherein the selected material of the cladding layer 550 can be the same as the selected material of the encapsulation layer 53. It should be understood that the routing structure 55 can be configured with multiple layers of cladding layers embedded with circuit layers and copper pillars according to requirements.

Therefore, the copper pillars 51, the conductive copper pillars 52, the first circuit layer 54 and the encapsulation layer 53 may serve as a build-up circuit structure 5b which has a third side 53a and a fourth side 53b opposing the third side 53a, and the build-up circuit structure 5b is stacked on the first side 20a of the insulator 20 by the fourth side 53b thereof and is electrically connected to the spiral inductor circuits 22, 22a, so that the electronic element 50 is embedded and packaged in the build-up circuit structure 5b and electrically connected to the build-up circuit structure 5b, so as to achieve the electrical requirements of high-current products and improve the inductance value and quality factor.

FIG. 6A, FIG. 6B, FIG. 6C, FIG. 6D-1 and FIG. 6E are schematic cross-sectional views illustrating a method for fabricating an electronic package 6 according to the second embodiment of the present disclosure. The main difference between this embodiment and the first embodiment is the process sequence of the inductor structure 2, so the same points will not be repeated below.

Figure 6A:
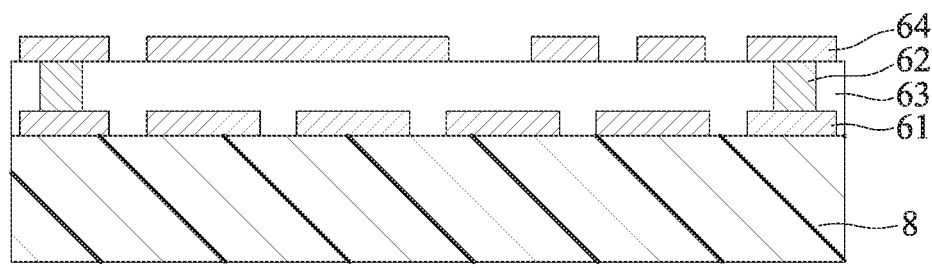

As shown in FIG. 6A, a carrier structure 63 is formed on a support member 8 such as a metal plate. A first routing layer 61 bonded onto the support member 8 and a plurality of copper pillars 62 disposed on the first routing layer 61 are arranged inside the carrier structure 63, and a second routing layer 64 electrically connected to the copper pillars 62 is formed on the surface of the carrier structure 63.

In an embodiment, the carrier structure 63 is a dielectric material, such as Ajinomoto build-up film (ABF), photosensitive resin, polyimide (PI), bismaleimide triazine (BT), FR5 prepreg (PP), molding compound (e.g., molding resin), molded epoxy resin (e.g., epoxy molding compound [EMC]), or other suitable materials, and the carrier structure 63 forms a coreless carrier board with the first routing layer 61, the copper pillars 62 and the second routing layer 64. It should be understood that the carrier structure 63 can also be other boards for carrying chips, such as a lead frame, a silicon interposer, a package substrate with a core layer, or other suitable structures.

Figure 6B:
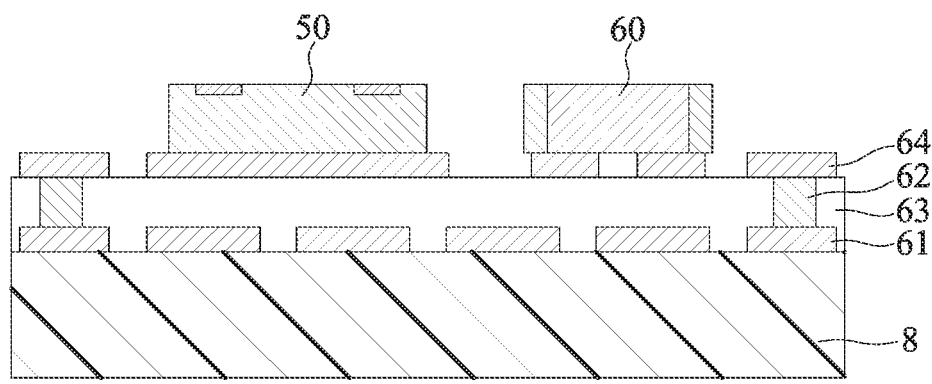

As shown in FIG. 6B, a plurality of electronic elements 50, 60 may be arranged on the carrier structure 63, wherein the electronic element 60 such as a passive element can be arranged to be electrically connected to the second routing layer 64.

Figure 6C:
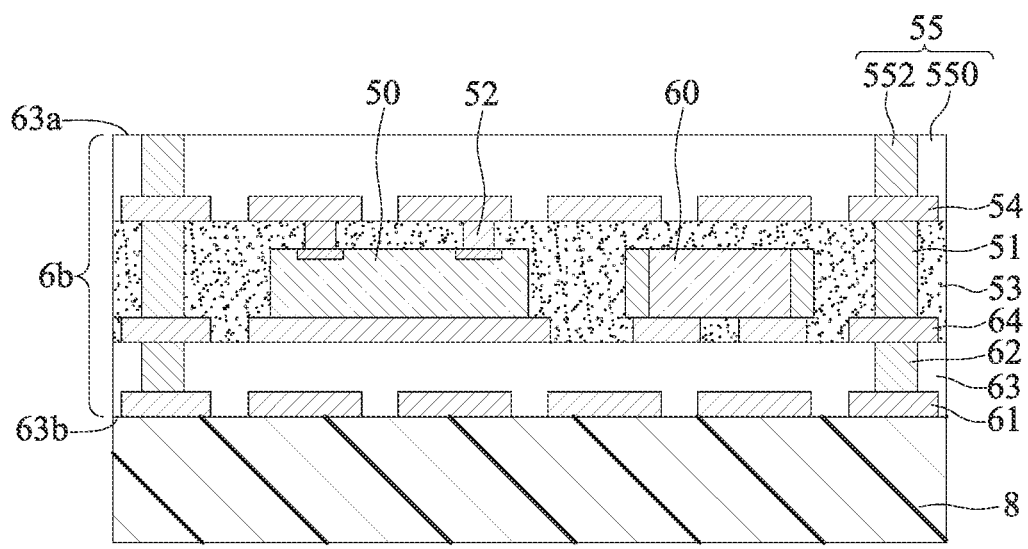

As shown in FIG. 6C, after forming the copper pillars 51 on the second routing layer 64 and forming the conductive copper pillars 52 on the electrode pads 500 of the electronic element 50, the encapsulation layer 53 is formed on the carrier structure 63 by the process shown in FIG. 5B to FIG. 5C-1, and the first circuit layer 54 electrically connected to the copper pillars 51 and the conductive copper pillars 52 is formed on the encapsulation layer 53. Then, the routing structure 55 is formed on the encapsulation layer 53 and the first circuit layer 54.

Therefore, the first routing layer 61, the copper pillars 62, the carrier structure 63, the second routing layer 64, the copper pillars 51, the conductive copper pillars 52, the first circuit layer 54, the routing structure 55 and the encapsulation layer 53 may serve as a build-up circuit structure 6b, which has a third side 63a and a fourth side 63b opposing the third side 63a, so that the electronic elements 50, 60 are embedded and packaged in the build-up circuit structure 6b and electrically connected to the build-up circuit structure 6b.

Figures 1, 6D:
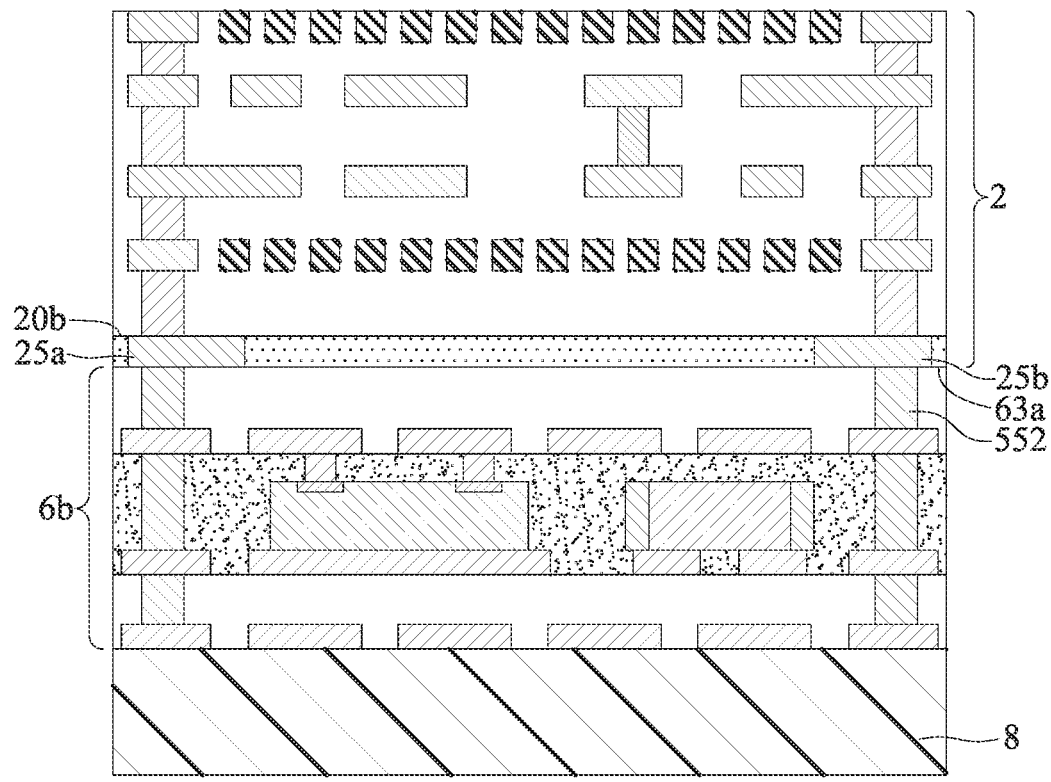
Figures 2, 6D:
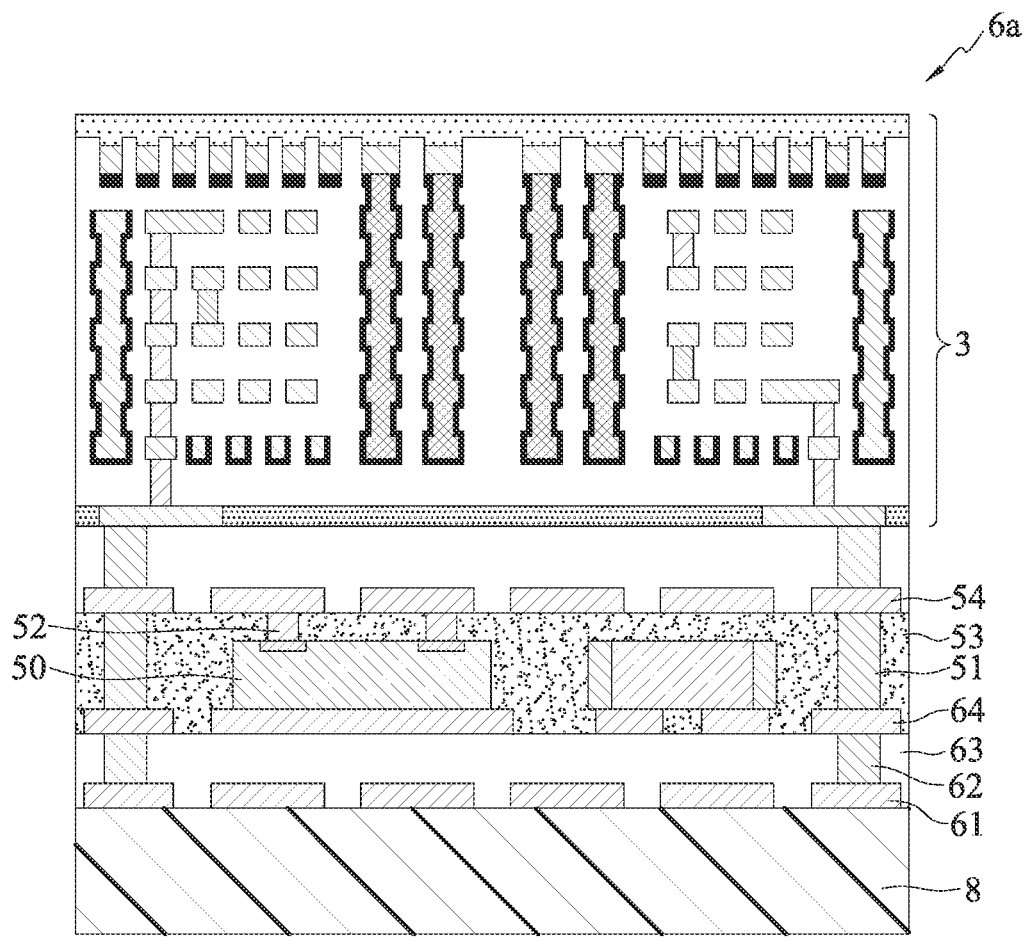

As shown in FIG. 6D-1, the inductor structure 2 as shown in FIG. 2A is formed on the routing structure 55 on the third side 63a of the build-up circuit structure 6b, so that the inductor structure 2 is bonded onto the routing structure 55 by the second side 20b of the insulator 20 of the inductor structure 2.

In an embodiment, end surfaces of the copper pillars 552 are electrically connected to the first and second electrical connecting pads 25a, 25b, so that the electronic elements 50, 60 are electrically connected to the inductor structure 2, so as to achieve the electrical requirements of high-current products and improve the inductance value and quality factor.

Figure 6E:
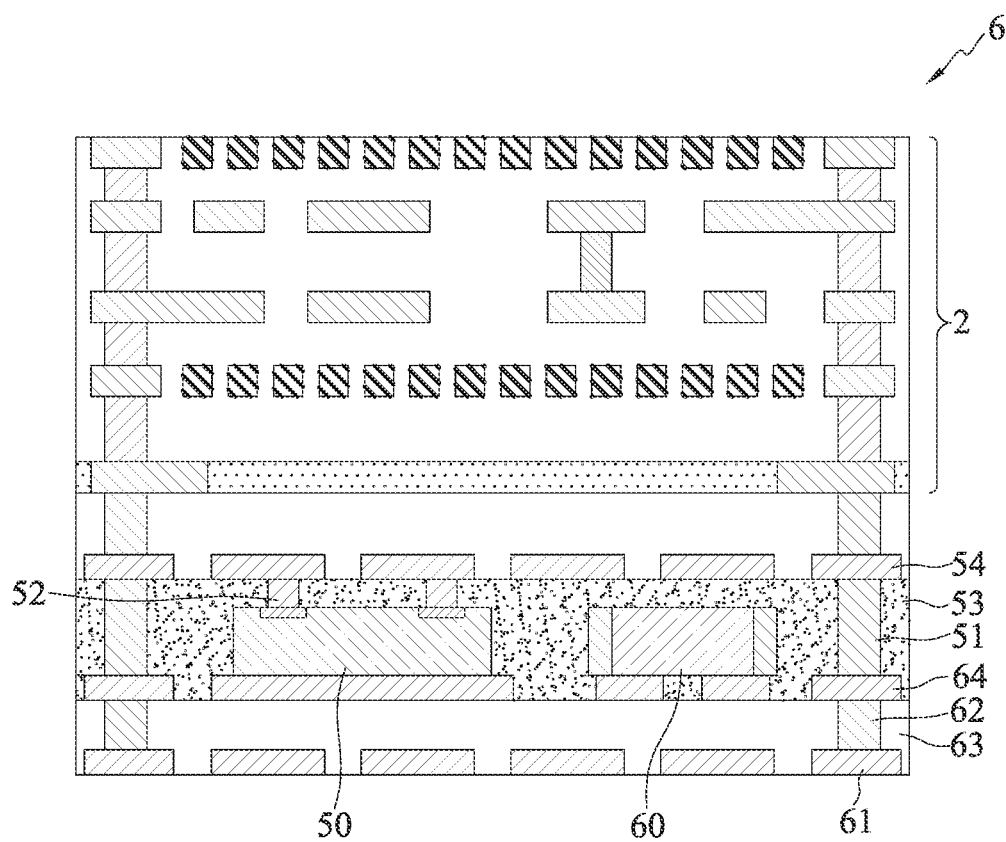

As shown in FIG. 6E, the support member 8 is removed to expose the carrier structure 63 and the first routing layer 61, so that the first routing layer 61 serves as an external port.

It should be understood that in the first and second embodiments, the inductor structure 3 shown in FIG. 3A can also be used for the packaging process. For example, in the process shown in FIG. 6D-1, the routing structure 55 can be arranged with the inductor structure 3 shown in FIG. 3A, such as an electronic package 6a shown in FIG. 6D-2.

Figure 7A:
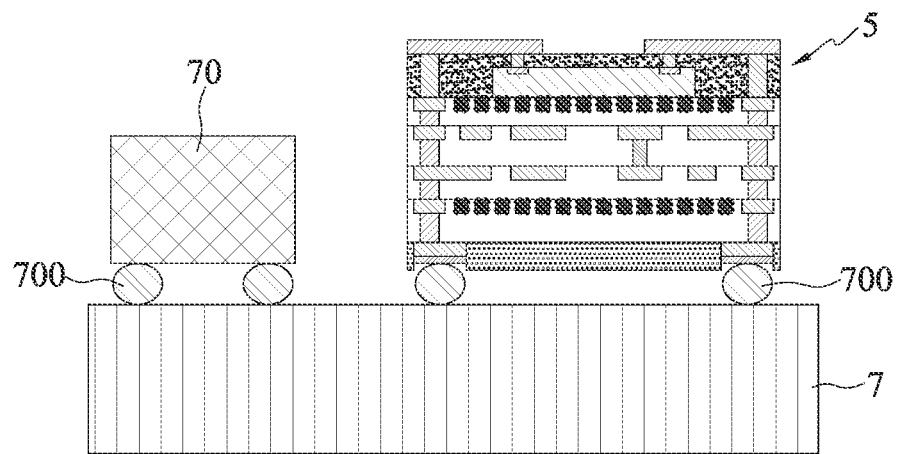
FIG. 7A to FIG. 7F are schematic cross-sectional views illustrating different applications of the electronic packages of the present disclosure.
Figure 7B:
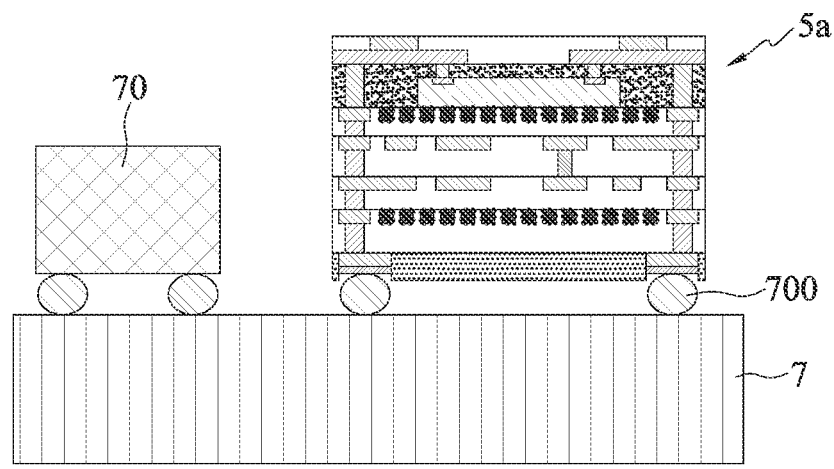
Figure 7C:
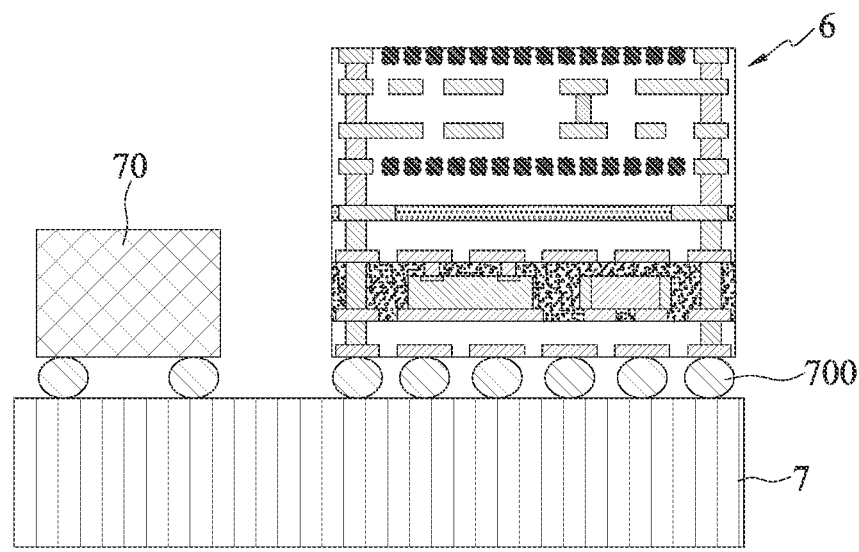
Figure 7D:
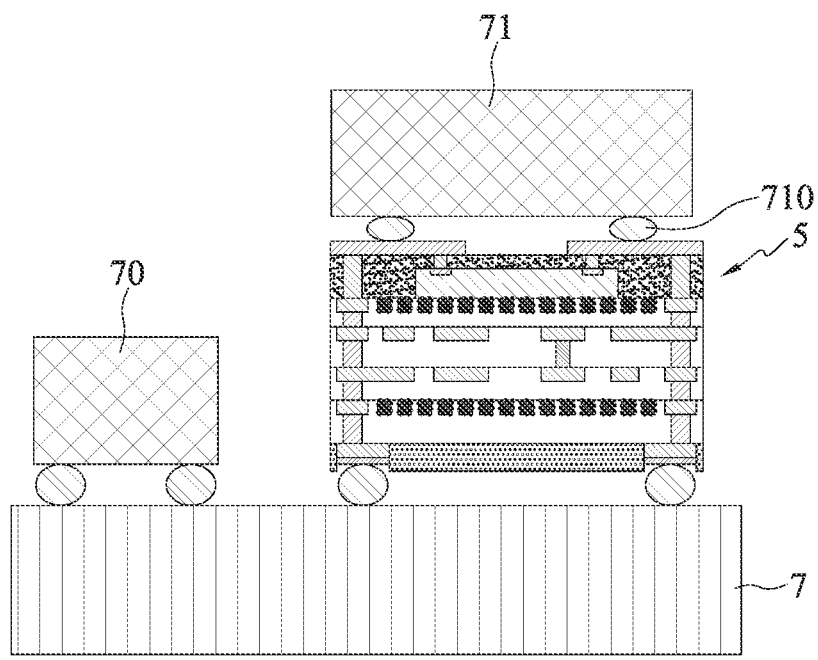
Figure 7E:
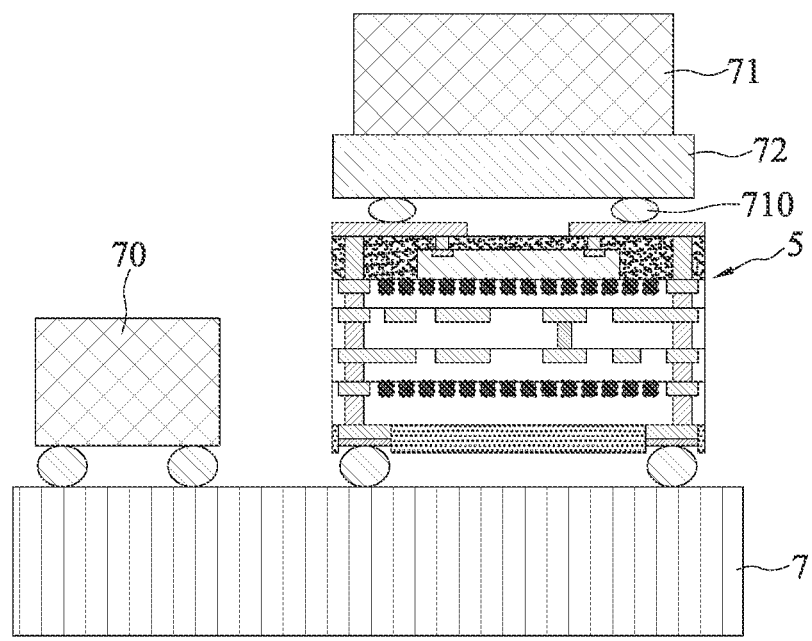
Figure 7F:
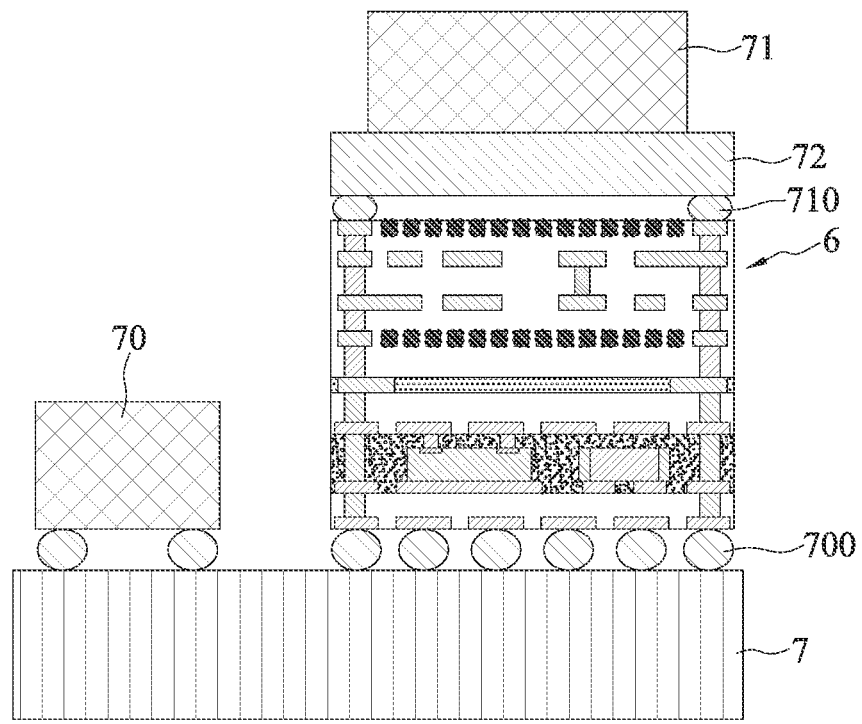

Further, in subsequent applications, the electronic package 5, 5a, 6, 6a can be mounted on a circuit board 7 via solder balls 700, as shown in FIG. 7A, FIG. 7B and FIG. 7C, and a functional element 70 may be further mounted on the circuit board 7. Further, another functional element 71 can also be stacked on the electronic package 5, 5a, 6, 6a via a solder material 710, as shown in FIG. 7D. Even the functional element 71 can be stacked on the electronic package 5, 5a, 6, 6a via an interposer 72, as shown in FIG. 7E and FIG. 7F.

To sum up, the electronic package 5, 5a, 6, 6a of the present disclosure can easily carry out mass production of a large panel due to the inductor structure 2, 3 can be manufactured by the processing method of the package carrier, and the magnetic material is formed in a manner of electroplating or deposition by using the patterned build-up circuit manufacturing method in an aspect of coreless, so that the control of the precision of the shielding layers 21a, 21b, 31, 31a is excellent. Therefore, compared with the prior art, the precision of the geometric patterns of the inductor structure 2, 3 (such as the spiral shape of the inductor circuit

22, 32 and the pattern of the shielding layers 21*a*, 21*b*, 31, 31*a*) used in the electronic package 5, 5*a*, 6, 6*a* of the present disclosure is good, and the control of the precision of the inductance value is excellent.

Further, since the magnetic material and each of the insulating layers (such as the first to fourth insulating layers 40*a*, 40*b*, 40*c*, 40*d*) can be easily used for patterned circuit process, the inductor structure 2, 3 of the electronic package 5, 5*a*, 6, 6*a* facilitates various designs and applications.

Also, the shielding layers 21*a*, 21*b*, 31, 31*a* are designed with the line segments 210, 310 that are not connected with each other to enhance the magnetic shielding effect and the ability to resist electromagnetic interference, and also reduce the influence of eddy current and magnetic loss on the Q value.

In addition, compared with the configuration of the iron core block in the prior art, a thickness h of the inductor circuit 22, 32 of the inductor structure 2, 3 used in the electronic package 5, 5*a*, 6, 6*a* of the present disclosure (as shown in FIG. 2A) can be adjusted without the need to configure with the iron core block according to requirements, so it is easier to miniaturize, so that the end product can meet the needs of miniaturization. It should be understood that, compared with the configuration of the magnetic powder dielectric layer in the prior art, the insulator 20 of the inductor structure 2, 3 used in the electronic package 5, 5*a*, 6, 6*a* of the present disclosure can be easily fabricated without doping magnetic powder. Therefore, the production cost can be further reduced, so as to facilitate the end product to meet the needs of economic benefits.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
   an insulator having a first side and a second side opposing the first side;
   a plurality of layers of spiral inductor circuits embedded in the insulator in a form of layered interval stacking;
   at least one conductor embedded in the insulator and connected to any two of the adjacent spiral inductor circuits stacked at interval;
   a plurality of shielding layers oppositely embedded in the first side and the second side of the insulator to shield the spiral inductor circuits without being electrically connected to the spiral inductor circuits, wherein the plurality of shielding layers comprise a plurality of line segments without connecting to each other;
   a build-up circuit structure having a third side and a fourth side opposing the third side and stacked on the first side of the insulator via the fourth side thereof, wherein the build-up circuit structure is electrically connected to the spiral inductor circuits; and
   at least one electronic element embedded and packaged in the build-up circuit structure and electrically connected to the build-up circuit structure via fan-out conductive copper pillars.

2. The electronic package of claim 1, wherein a material for forming the insulator comprises Ajinomoto build-up film, polyimide, or molded epoxy resin.

3. The electronic package of claim 1, further comprising at least one copper pillar embedded in the insulator and electrically connected to at least one end of the spiral inductor circuits, at least one electrical connecting pad formed on the first side or the second side of the insulator and electrically connected to the copper pillar, wherein the electrical connecting pad is exposed from the insulator, and a cross-sectional shape and an area of the copper pillar are correspondingly similar to those of the electrical connecting pad.

4. The electronic package of claim 1, wherein the conductor corresponds to a shape of each of the spiral inductor circuits to form an arc-shaped sheet body or an arc-shaped wall body.

5. The electronic package of claim 1, wherein the plurality of line segments without connecting to each other of the shielding layers are arranged in a pattern of a circular outline or a polygonal outline to present in a radial shape, a polycyclic shape, or a straight-parallel shape.

6. The electronic package of claim 1, wherein a composition of the shielding layers comprises a magnetic material or a non-magnetic metal, and the magnetic material is at least one of iron (Fe), nickel (Ni), cobalt (Co), manganese (Mn), zinc (Zn), or a combination thereof.

7. The electronic package of claim 1, wherein partial surfaces of the shielding layers are provided with a magnetic layer comprising a magnetic material, and the shielding layers are composed of a non-magnetic metal, and the magnetic material is at least one of iron (Fe), nickel (Ni), cobalt (Co), manganese (Mn), zinc (Zn), or a combination thereof.

8. The electronic package of claim 1, further comprising a core body embedded in the insulator and the core body comprising at least one annular conductive pillar or at least one solid conductive pillar, wherein the spiral inductor circuits surround the core body, and a composition of the core body comprises a magnetic material or a non-magnetic metal.

9. The electronic package of claim 8, wherein a partial surface of the core body is provided with a magnetic layer comprising a magnetic material, and the core body is composed of a non-magnetic metal.

10. The electronic package of claim 1, further comprising a shielding member embedded in the insulator and surrounding the spiral inductor circuits, wherein the shielding member is an arc-segment-shaped plate body or an arc-segment-shaped wall body arranged in a ring shape, and a composition of the shielding member comprises a magnetic material or a non-magnetic metal.

11. The electronic package of claim 10, wherein a partial surface of the shielding member is provided with a magnetic layer comprising a magnetic material, and the shielding member is composed of a non-magnetic metal.

12. An electronic package, comprising:
   a build-up circuit structure having a third side and a fourth side opposing the third side;
   at least one electronic element embedded and packaged in the build-up circuit structure and electrically connected to the build-up circuit structure via fan-out conductive copper pillars;
   an insulator having a first side and a second side opposing the first side, wherein the insulator is stacked on the third side of the build-up circuit structure via the second side thereof;
   a plurality of layers of spiral inductor circuits embedded in the insulator in a form of layered interval stacking, wherein the spiral inductor circuits are electrically connected to the build-up circuit structure;

at least one conductor embedded in the insulator and connected to any two of the adjacent spiral inductor circuits stacked at interval; and a plurality of shielding layers oppositely embedded in the first side and the second side of the insulator to shield the spiral inductor circuits without being electrically connected to the spiral inductor circuits, wherein the plurality of shielding layers comprise a plurality of line segments without connecting to each other.

13. The electronic package of claim 12, wherein a material for forming the insulator comprises Ajinomoto build-up film, polyimide, or molded epoxy resin.

14. The electronic package of claim 12, further comprising at least one copper pillar embedded in the insulator and electrically connected to at least one end of the spiral inductor circuits, and at least one electrical connecting pad formed on the first side or the second side of the insulator and electrically connected to pad formed on the first side or the second side of the insulator and electrically connected to the copper pillar, wherein the electrical connecting pad is exposed from the insulator, and a cross-sectional shape and an area of the copper pillar are correspondingly similar to those of the electrical connecting pad.

15. The electronic package of claim 12, wherein the conductor corresponds to a shape of each of the spiral inductor circuits to form an arc-shaped sheet body or an arc-shaped wall body.

16. The electronic package of claim 12, wherein the plurality of line segments without connecting to each other of the shielding layers are arranged in a pattern of a circular outline or a polygonal outline to present in a radial shape, a polycyclic shape, or a straight-parallel shape.

17. The electronic package of claim 12, wherein a composition of the shielding layers comprises a magnetic material or a non-magnetic metal, and the magnetic material is at least one of iron (Fe), nickel (Ni), cobalt (Co), manganese (Mn), zinc (Zn), or a combination thereof.

18. The electronic package of claim 12, wherein partial surfaces of the shielding layers are provided with a magnetic layer comprising a magnetic material, and the shielding layers are composed of a non-magnetic metal, and the magnetic material is at least one of iron (Fe), nickel (Ni), cobalt (Co), manganese (Mn), zinc (Zn), or a combination thereof.

19. The electronic package of claim 12, further comprising a core body embedded in the insulator and the core body comprising at least one annular conductive pillar or at least one solid conductive pillar, wherein the spiral inductor circuits surround the core body, and a composition of the core body comprises a magnetic material or a non-magnetic metal.

20. The electronic package of claim 19, wherein a partial surface of the core body is provided with a magnetic layer comprising a magnetic material, and the core body is composed of a non-magnetic metal.

21. The electronic package of claim 12, further comprising a shielding member embedded in the insulator and surrounding the spiral inductor circuits, wherein the shielding member is an arc-segment-shaped plate body or an arc-segment-shaped wall body arranged in a ring shape, and a composition of the shielding member comprises a magnetic material or a non-magnetic metal.

22. The electronic package of claim 21, wherein a partial surface of the shielding member is provided with a magnetic layer comprising a magnetic material, and the shielding member is composed of a non-magnetic metal.

* * * * *